United States Patent
Niira et al.

(12) 
(10) Patent No.: US 9,112,088 B2
(45) Date of Patent: Aug. 18, 2015

(54) METHOD FOR MANUFACTURING A THIN-FILM SOLAR CELL USING A PLASMA BETWEEN PARALLEL ELECTRODES

(75) Inventors: Koichiro Niira, Higashiomi (JP); Norikazu Ito, Moriyama (JP); Shinichiro Inaba, Shiga (JP)

(73) Assignee: KYOCERA Corporation, Kyoto (JP)

( * ) Notice: Subject to any disclaimer, the term of this patent is extended or adjusted under 35 U.S.C. 154(b) by 246 days.

(21) Appl. No.: 13/642,736

(22) PCT Filed: Apr. 22, 2011

(86) PCT No.: PCT/JP2011/059959
§ 371 (c)(1),
(2), (4) Date: Oct. 22, 2012

(87) PCT Pub. No.: WO2011/132775
PCT Pub. Date: Oct. 27, 2011

(65) Prior Publication Data
US 2013/0040414 A1    Feb. 14, 2013

(30) Foreign Application Priority Data

Apr. 22, 2010 (JP) .................. 2010-098994
Dec. 27, 2010 (JP) .................. 2010-290412

(51) Int. Cl.
*H01L 21/00* (2006.01)
*H01L 31/076* (2012.01)
(Continued)

(52) U.S. Cl.
CPC .......... *H01L 31/076* (2013.01); *C23C 16/4557* (2013.01); *C23C 16/45565* (2013.01);
(Continued)

(58) Field of Classification Search
CPC .... C23C 16/24; C23C 16/545; C23C 16/509; C23C 16/45565; C23C 16/4557; C23C 16/46; Y02E 10/548; Y02E 10/50; Y02E 10/52; Y02E 10/545; Y02E 10/547; H01L 21/0262; H01L 31/202; H01L 21/02422; H01L 21/02532; H01L 31/075; H01L 21/02573; H01L 31/03685; H01L 31/03762; H01L 31/03921; H01L 31/076; H01L 31/1824

USPC ..................... 438/57; 257/E31.011
See application file for complete search history.

(56) References Cited

U.S. PATENT DOCUMENTS 5,492,734 A * 2/1996 Matsumoto et al. .......... 427/535
6,265,288 B1   7/2001 Okamoto et al.
(Continued)

FOREIGN PATENT DOCUMENTS

JP    H11-145499 A    5/1999
JP    2000-174310 A   6/2000
(Continued)

OTHER PUBLICATIONS

International Search Report dated Jul. 26, 2011, issued for International Application No. PCT/JP2011/059959.

*Primary Examiner* — Duy T Nguyen
(74) *Attorney, Agent, or Firm* — Procopio, Cory, Hargreaves & Savitch LLP

(57) ABSTRACT

Disclosed is a method for manufacturing a thin-film solar cell using plasma between a couple of parallel electrodes. In the method, a base member is placed in a chamber between a first electrode and a second electrode facing each other. A hydrogen gas is heated, and thus heated hydrogen gas and a silicon-based gas are introduced into a space between the first electrode and the second electrode. A ratio of a flow rate of the heated hydrogen gas to that of the silicon-based gas is at least 25 and no more than 58. A plasma is generated between the first electrode and the second electrode by applying high-frequency power to the second electrode while a pressure in the chamber is 1000 Pa or higher, and an optically active layer containing crystalline silicon is deposited on the base material.

11 Claims, 18 Drawing Sheets

(51) Int. Cl.
  *C23C 16/455* (2006.01)
  *C23C 16/46* (2006.01)
  *C23C 16/509* (2006.01)
  *H01L 21/02* (2006.01)
  *H01L 31/0368* (2006.01)
  *H01L 31/0376* (2006.01)
  *H01L 31/0392* (2006.01)
  *H01L 31/18* (2006.01)
  *H01L 31/20* (2006.01)

(52) U.S. Cl.
  CPC ............ *C23C16/46* (2013.01); *C23C 16/509* (2013.01); *H01L 21/0262* (2013.01); *H01L 21/02532* (2013.01); *H01L 21/02573* (2013.01); *H01L 31/03685* (2013.01); *H01L 31/03762* (2013.01); *H01L 31/03921* (2013.01); *H01L 31/1824* (2013.01); *H01L 31/202* (2013.01); *Y02E 10/545* (2013.01); *Y02E 10/548* (2013.01)

(56) References Cited

U.S. PATENT DOCUMENTS

| | | | |
|---|---|---|---|
| 2005/0101155 A1* | 5/2005 | Bang et al. | 438/761 |
| 2007/0184191 A1 | 8/2007 | Takai et al. | |
| 2008/0199614 A1* | 8/2008 | Li et al. | 427/255.34 |
| 2011/0135843 A1 | 6/2011 | Niira et al. | |

FOREIGN PATENT DOCUMENTS

| | | | |
|---|---|---|---|
| JP | 2003-173980 A | | 6/2003 |
| JP | 2003173980 | * | 6/2003 |
| JP | 2007-208093 A | | 8/2007 |
| WO | 2010/013746 A1 | | 2/2010 |
| WO | WO2010013746 | * | 2/2010 |

\* cited by examiner

FIG. 12
(a)
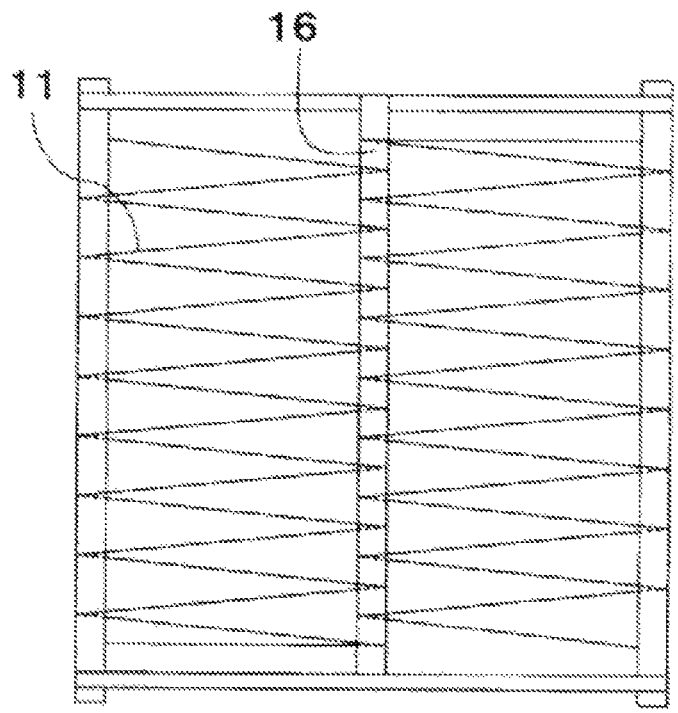
(b)
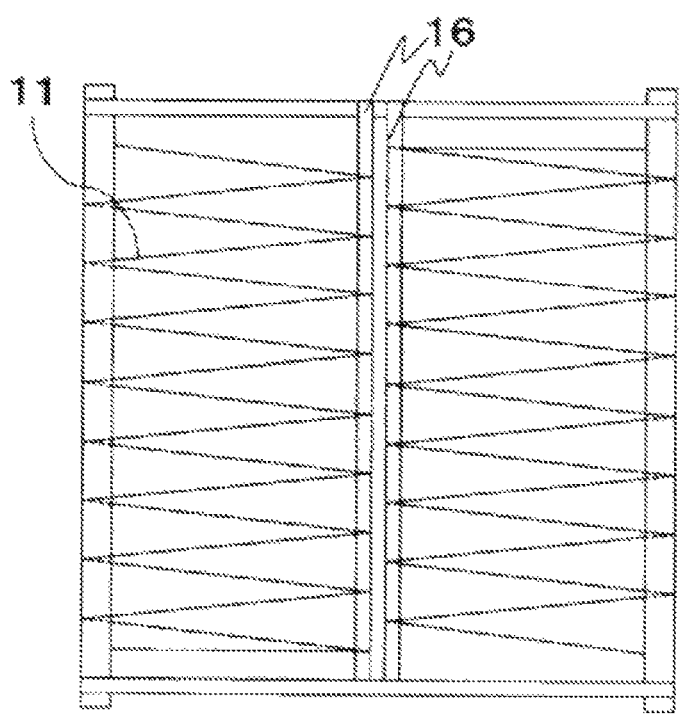

METHOD FOR MANUFACTURING A THIN-FILM SOLAR CELL USING A PLASMA BETWEEN PARALLEL ELECTRODES

The present application is the U.S. national stage of PCT/JP2011/059959 filed 22 Apr. 2011, which claims priority to Japanese patent application number 2010-290412 filed 27 Dec. 2010 and also claims priority to Japanese patent application number 2010-098994 filed 22 Apr. 2010, each of which is incorporated herein by reference in its entirety.

FIELD OF ART

The present invention relates to a method for manufacturing a thin-film solar cell that forms a thin film on a base member.

BACKGROUND ART

In the past, a film deposition apparatus that forms a thin film of silicon or the like on a base member such as a glass substrate was provided with a chamber, a gas introduction path that introduces a source gas into the chamber, and a pair of electrodes disposed within the chamber. The base member for deposition formation of the film is placed on one of the pair of electrodes, and a high-frequency power supply is connected to the other of the pair of electrodes for applying high-frequency power.

A plasma is generated in a space sandwiched between the pair of electrodes by the high-frequency power applied to the other of the pair of electrodes. The source gas is decomposed, excited, and activated by this plasma, thereby generating a variety of activated species. A portion of these species is deposited onto the base member so as to form a film.

At present, in thin-film silicon-based solar cells, in order to improve the photovoltaic conversion efficiency and reduce the manufacturing cost of the solar cell, there is a need for a manufacturing method capable of forming a high-quality thin film even when the film is deposited at a high rate.

As a method for manufacturing a thin-film silicon-based solar cell, technology has been proposed (refer to the Patent Reference 1 below) whereby the pressure within a chamber is set to 3 Torr (approximately 400 Pa) or greater, and the source gas includes a silane-based gas and hydrogen gas, with the flow rate of hydrogen gas being at least 50 times greater than that of the silane-based gas.

PRIOR ART REFERENCE

Patent Reference

Patent Reference 1: Japanese Laid-open Patent Publication No. H11-145499

SUMMARY OF THE INVENTION

Problem to be Solved by the Invention

However, the upper limit of the deposition rate is usually less than 1.1 nm/s, and in order to increase productivity it is necessary to deposit the film at a high rate while maintaining the high quality of the film.

Although making the gas pressure in the chamber high improves the film deposition rate, if the pressure is made excessively high, orders of silane higher than $SiH_3$ which form the main component of the film are generated, and there is a risk of a decrease in the quality of the film. Also, even if the flow rate of hydrogen is increased in order to reduce the generation of high-order silane, because the absolute amount of silane-based gas is reduced, the deposition rate decreases.

If a high high-frequency power is applied to increase the deposition rate, damage to the film increases, causing a decrease in the quality of the film.

Given the above, an object of the present invention is to provide a method for manufacturing a thin-film solar cell that is capable of depositing a high-quality film, even at a high film deposition rate.

Means for Solving the Problem

According to the present invention, a method for manufacturing a thin-film solar cell is a method for manufacturing a thin-film solar cell including a photovoltaic conversion layer that includes at least one photoactive layer containing crystalline silicon on a base member, and comprises: a base member preparation step in which a base member is disposed, in a chamber comprising a first electrode for use as an anode and a second electrode which is disposed in opposition to the first electrode, for use as a cathode to which high-frequency power is applied, between the first electrode and the second electrode; and a photoactive layer formation step in which a silicon-based gas that includes silicon and heated hydrogen gas with a flow rate ratio that is at least 25 times and no more than 58 times that of the silicon-based gas are supplied between the first electrode and the second electrode so that a gas pressure in the chamber is 1000 Pa or higher, and a plasma that is generated between the first electrode and the second electrode by application of high frequency power to the second electrode forms the photoactive layer on the base member.

Effect of the Invention

According to the above-noted method for manufacturing a thin-film solar cell, by enabling the formation of a high-quality thin-film solar cell even at a high film deposition rate, it is possible to provide a thin-film solar cell having a high photovoltaic conversion efficiency.

BRIEF DESCRIPTION OF THE DRAWINGS

FIGS. 12 (a) and (b) are plan vies schematically showing examples of the structure of heated bodies used in the method for manufacturing a thin-film solar cell according to the present invention.

EMBODIMENTS FOR PRACTICING THE INVENTION

An embodiment of a method for manufacturing a solar cell according the present invention will be described in detail below, with references made to the drawings.

<Basic Structure of the Thin-Film Deposition Apparatus>

Figure 1:
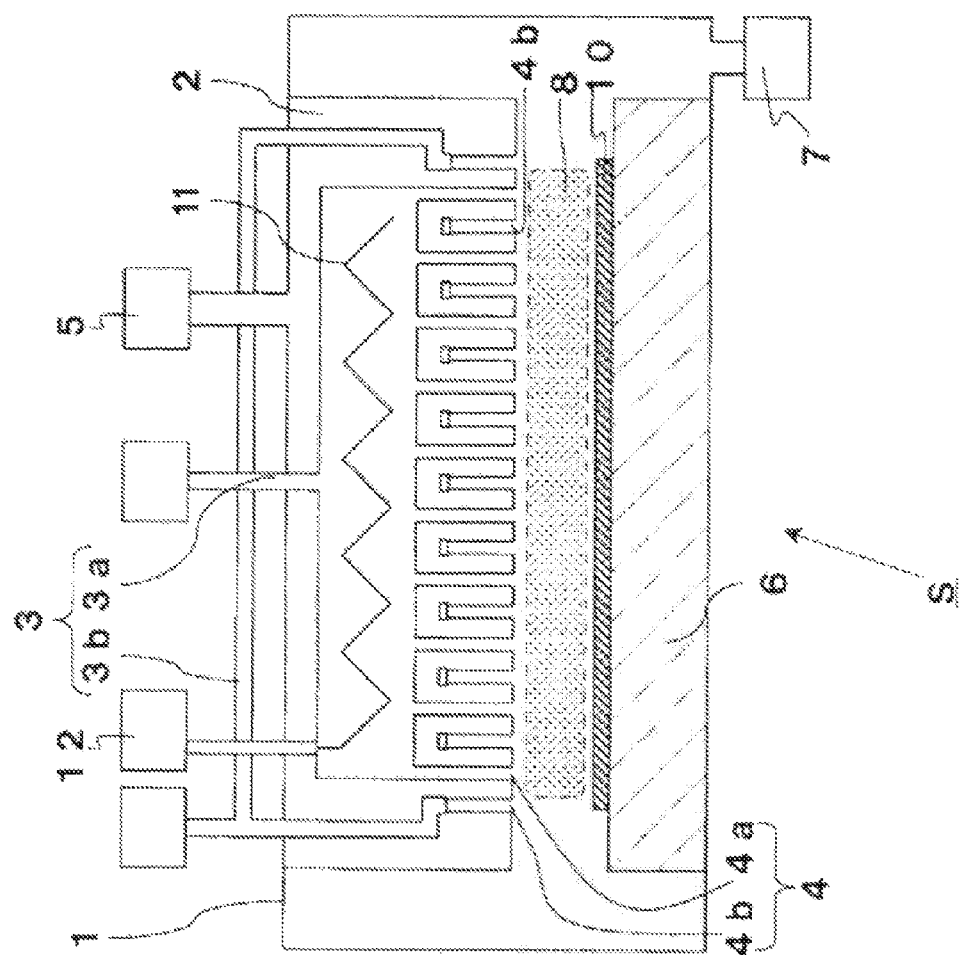
FIG. 1 is a schematic cross-sectional view showing an example of a thin-film deposition apparatus used in a method for manufacturing a thin-film solar cell according to the present invention.

The basic structure of the thin film deposition apparatus used in the present embodiment will be described. As shown in FIG. 1, the thin-film deposition apparatus S has a chamber 1, a first electrode 6 positioned in the chamber 1, a second electrode 2, positioned in the camber 1 and separated from the first electrode 6, and having first supplying parts 4a that can supply a first source gas and a second supplying parts 4b that can supply a second source gas, an introduction path that is connected to the first supplying parts 4a introducing the first source gas, a heated body 11 disposed within the introduction path, and a control means (not shown) that controls the gas supply from the first supplying part 4a, the gas supply from the second supplying parts 4b, and the heating of the heated body 11.

In this case, the second electrode 2 has a function of a shower electrode. The base member 10 onto which a thin film is deposited is disposed between the first electrode 6 and the second electrode 2 in the chamber 1. It is sufficient that the base member be positioned between the first electrode 6 and the second electrode 2, and it need not be directly supported by the first electrode 6.

The chamber 1 is a vacuum vessel that minimally has a reaction space that can be evacuated and that is constituted by a top wall, one or more side walls, and a bottom wall. The inside of such chamber 1 is evacuated by a vacuum pump 7, and the internal pressure therein is adjusted by a pressure regulator (not shown). The chamber 1 is constituted by a metal member such as stainless steel or aluminum.

The first electrode 6 has the function of an anode electrode, and has a heater that adjusts the temperature of the base member 10. In this manner, the first electrode 6 functions also as a temperature regulating mechanism for the base member 10, by which the base member 10 is adjusted to, for example, 100 to 400° C. and, more preferably, 150 to 350° C. The first electrode 6 is constituted by a metal material such as stainless steel or aluminum.

The base member 10 can be made of various materials that can withstand the above-noted temperatures, for example, a plate member made of a glass substrate or the like, or a film member made of a metal or resin film or the like.

A high-frequency power supply 5 is connected to the second electrode 2 and supplies the second electrode 2 with high-frequency power. By applying high-frequency power from the high-frequency power supply 5 to the second electrode 2, a plasma is formed in a space 8 positioned between the second electrode 2 and the base member 10.

The second electrode 2 is disposed in opposition to the first electrode 6 and functions as a cathode electrode. The second electrode 2 has a plurality of supplying parts 4 that supply gas introduced via the introduction path 3 into the chamber 1. These supplying parts 4 are opened facing toward the base member 10.

A first introduction path 3a and a second introduction path 3b are respectively connected to a plurality of gas tanks (not shown) that hold different gases. The gases that are introduced from the first introduction path 3a and the second introduction path 3b pass through the first supplying parts 4a and the second supplying parts 4b, respectively, and are not mixed until they reach the space 8.

The gases that are supplied to the plurality of supplying parts 4 include a first source gas that is supplied to the first supplying parts 4a, and a second source gas that is supplied to the supplying parts 4b and that has a higher probability of decomposition than the first source gas. The overall decomposition rate of the gas is defined by the equation $\exp(-\Delta Ea/kTe) \times Ng \times Ne \times ve \times \sigma$. In this equation, $\Delta Ea$ is the excitation activation energy of the source gas (separation energy), k is the Boltzmann constant, Te is the electron temperature, Ng is the source gas concentration, Ne is the electrode concentration, ve is the electron velocity, and $\sigma$ is the collision cross-section area of the source gas. The $\exp(-\Delta Ea/kTe)$ means the decomposition probability. There are cases in which $\exp(-$ ΔEa/kTe)×σg is taken as the collision cross-sectional area. As will be described later, there are cases in which the flow of first source gas flowing in the first introduction path $3a$ is divided, with a part thereof flowing into the second introduction path $3b$ (thereby mixing it with the second source gas).

The first source gas and the second source gas are selected appropriately based on the material of the thin film. For example, if a Si-based thin film such as a-Si:H (hydrogenated amorphous silicon) or μc-Si:H (hydrogenated microcrystalline silicon) is to be formed, a non-Si-based gas can be used as the first source gas and an Si-based gas can be used as the second source gas. $H_2$ (hydrogen) is used as the non-Si-based gas. One or more types selected from $SiH_4$ (silane), $Si_2H_6$ (disilane), $SiF_4$ (silicon tetrafluoride), $Si_2F_6$ (silicon hexafluoride), and $SiH_2Cl_2$ (dichlorosilane) or the like can be used as the silicon-based gas. In a case of introducing a doping gas, $B_2H_6$ (diborane) gas or the like is used to form a p-type Si-based film, and $PH_3$ (phosphine) gas or the like is used to form an n-type Si-based film. It is possible to select, as necessary, either the first introduction path $3a$ or the second introduction path $3b$ as the introduction path for the doping gas. However, as will be described later, if a heated body 11 connected to the heating source power supply 12 is provided within the first introduction path $3a$, it is preferable to introduce the doping gas via the second introduction path $3b$.

A heated catalyzer or resistance heater or the like is used as the heated body 11 provided within the first introduction path $3a$. For example, the heated catalyzer, by passing current through the medium to heat the medium to the heating temperature, functions so as to excite and activate (decompose) gas that comes into contact therewith. At least the surface of the heated catalyzer is made of a metal material. It is preferable that the metal material be made of a metal material or an alloy material of at least one type of Ta, W, Re, Os, Ir, Nb, Mo, Ru, and Pt, which are high melting point metal materials. The shape of the heated catalyzer is, for example, the above-noted metal material formed into the shape of a wire, a sheet, or a mesh. By making the temperature of the heated catalyzer 400° C. to 2000° C., the first source gas is heated and excited, and excitation is done in the space 8 as well.

Figure 2:
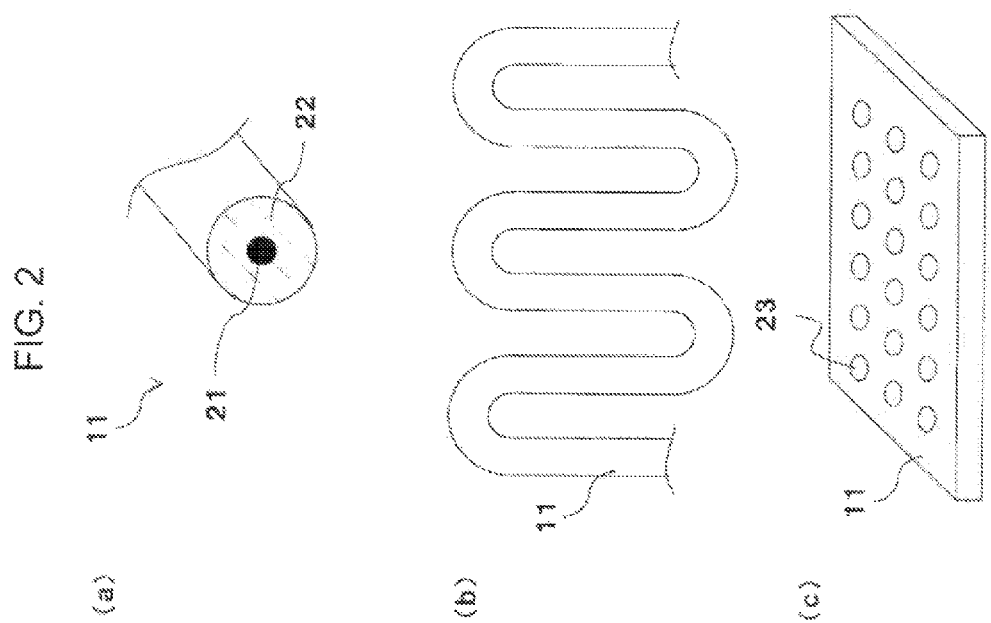
FIG. 2 is a drawing schematically showing an example of the structure of a heated body used in the method for manufacturing a thin-film solar cell according to the present invention, (a) being a partial perspective view of a part of a heated body with part thereof cut-away, (b) being a plan view showing an example of the shape of the heated body, and (c) being a perspective view of an example of a flat-sheet heated body.

For example, as shown in FIG. 2(a), the heated body 11 may be constituted by a heat-generating body 21 that serves as a high-temperature body, and a covering member 22 that covers the outer periphery of the heat-generating body 21. By adopting this constitution, the contact between the heat-generating body 21 and the first source gas is reduced. By doing this, it is possible to maintain the effect of high-speed deposition of a high-quality film by the thermal activation of the first gas, while greatly reducing hydrogen absorption into the heat-generating body 21 which are caused by the first source gas and hydrogen embrittlement by the hydrogenation reaction of heat-generating body material. As a result, it is possible to reduce maintenance that requires stoppage of the apparatus, and to improve productivity.

For example, a metal material such as an iron-chromium-aluminum-based alloy or nickel-chromium-based alloy, which exhibits resistance heating, or a metal material such as platinum, molybdenum, tantalum, or tungsten, which are high melting point metal materials, is used as the heat-generating body 21.

The covering member 22 can be a member that has resistance to heat and, for example, a metal member such as stainless steel, or a ceramic such as alumina or silicon nitride or the like can be used. When using a metal member, by filling between the heat-generating body 21 and the metal member with an insulating material such as magnesium oxide or the like, it is possible to achieve insulation between the heat-generating body 21 and the covering member 22. In this manner, the covering member 22 may have a multilayer structure. Also, it is preferable that the covering member 22 be constituted by a member having a high heat conductivity.

A high-temperature fluid may be used as the heat-generating body 21, and by causing a high-temperature fluid to flow in the covering member that serves as a pipe, it is possible by the thermal activation of the first source gas to maintain the effect of high-speed deposition of a high-quality film while greatly extending the life of the heat-generating body 11.

The shape of the heated body 11 may be, as shown in FIG. 2(b) a pipe with bends at a plurality of positions. Also, as shown in FIG. 2(c) it may be a flat sheet in which a large number of through holes 23 are provided. By increasing the surface area of the heated body 11 in this manner, it is possible to heat the first source gas with good efficiency.

Also, if a flat sheet with the through holes 23 such as shown in FIG. 2(c) is adopted as the heated body 11, by the first source gas passing through the through holes 23, not only is the first source gas caused to be distributed and the gas flow made uniform, but also it is possible to heat the first source gas with good efficiency.

Figure 3:
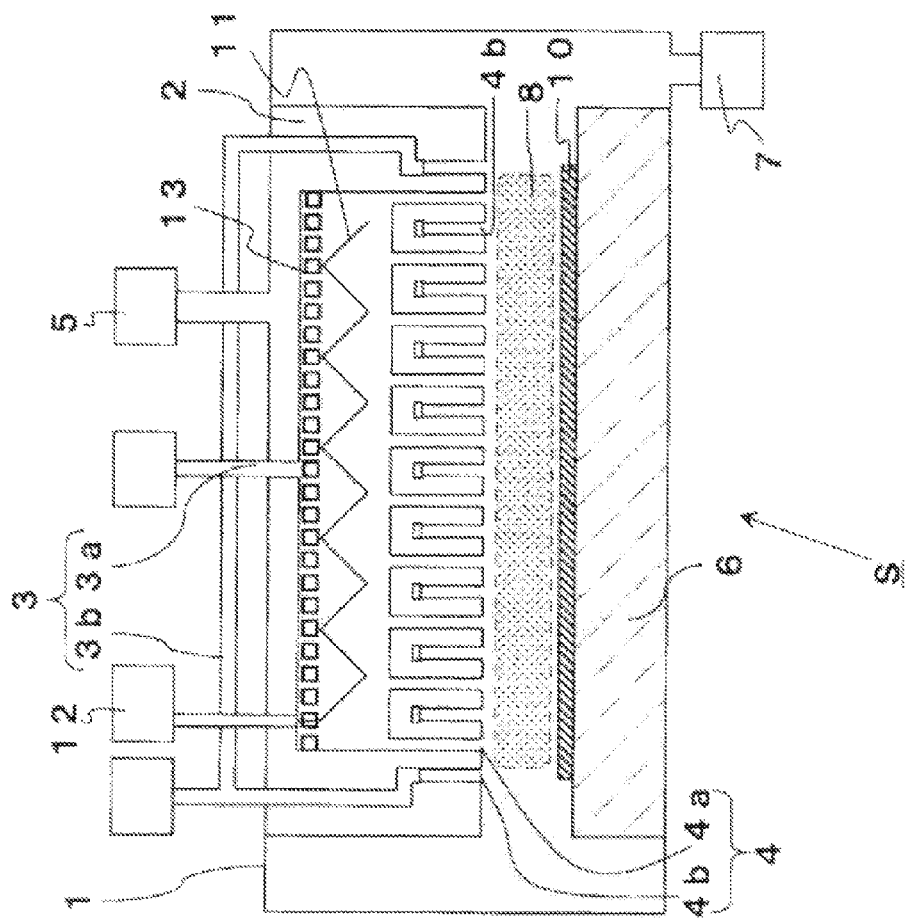
FIG. 3 is a schematic cross-sectional view showing an example of a thin-film deposition apparatus used in the method for manufacturing a thin-film solar cell according to the present invention.

Also, by providing a distribution plate 13 at the top part of the heated body 11, as shown in FIG. 3, the first source gas comes into contact with the heated body 11 uniformly, and it is possible to heat the first source gas with good efficiency.

The heating temperature of the heated body 11 may be made 400 to 1000° C., and the first source gas is not only heated and activated, but also there is activation in the space 8 as well. Also, by making the heating temperature no higher than 1000° C., warping of the chamber 1 or the peripheral members constituting the second electrode 2 is reduced, and it is possible to improve the mechanical life of the peripheral members and the like.

In particular, since the first source gas the temperature of which has been raised by the heated body 11 is supplied to the space 8, a high-order silane producing reactions in the space 8 caused by the gas heating effect are suppressed.

The high-order silane producing reaction is herein a reaction that produces a high polymer by $SiH_2$ insertion reactions of

$$SiH_4 + SiH_2 \rightarrow Si_2H_6 \qquad 1)$$

$$Si_2H_6 + SiH_2 \rightarrow Si_3H_8 \qquad 2)$$

after which the same $SiH_2$ insertion reactions continue.

By the collision of $SiH_4$ with electrons in the plasma, $SiH_2$ is generated together with the $SiH_3$, which become the main film deposition components. The higher the plasma excitation power is made in order to increase the film deposition rate, the more $SiH_2$ is produced, thereby, as a result, producing more high-order silane molecules.

If high-order silane that is produced in this manner becomes attached to the film deposition surface, the deposition reaction (film deposition reaction) at the film deposition surface is disturbed and the film quality worsens, and even if it is captured within the film, the film structure is disturbed, and the film quality worsens. This high-order silane producing reaction is an exothermic reaction, the reaction progressing by the release of the heat generated by the reaction into space. If, however, the space into which the heat of reaction is to be released (specifically, the space in which hydrogen gas is the main component) has already been heated by the gas heating effect, it becomes difficult to release the heat of reaction into the space. That is, it becomes difficult for the high-order silane producing reaction, which is an endothermic reaction, to progress.

As noted above, by using the heated body 11, it is possible to deposit a high-quality silicon film, even under high-speed film deposition conditions, in which the plasma excitation power is large. Also, as long as the heated body 11 can heat the gas to a prescribed temperature, it is not particularly restricted.

The first supplying parts 4a and the second supplying parts 4b may each be arranged in a variety of patterns, for example, a matrix pattern of regularly arranged points, or a staggered pattern. The number of first supplying parts 4a and the second supplying parts 4b may differ. If the flow rate of the first source gas differs from the flow rate of the second source gas, in the case in which the flow rate of the first source gas is larger than that of the second source gas, by making the number of first supplying parts 4a greater than that of the second supplying parts 4b, it is possible to maintain the balance of supply and to form a deposited film having a uniform distribution of film thickness and material.

The first introduction path 3a and the second introduction path 3b may be connected to a gas regulating unit that regulates the flow rate, flow velocity, and the temperature and the like of the gases.

In order to suppress the intrusion of impurities into the film from the evacuation system, it is preferable that the vacuum pump 7 that is used be a dry-type vacuum pump such as a turbomolecular pump. It is preferable that a vacuum of at least $1 \times 10^{-3}$ Pa or below, and more preferably, $1 \times 10^{-4}$ Pa or below be reached.

The thin-film deposition apparatus S includes a control means (not shown) that controls the timing of the supply of gas from the first supplying parts 4a, the supply of gas from the second supplying parts 4b, and the heating of the heated body 11. By the control means controlling the power applied to the heated body 11 by the heating power supply 12, the heated body 11 is controlled to a prescribed temperature. The temperature of the heated body is sensed and the timing of the supply of gas from the first supplying parts 4a and the second supplying parts 4b is controlled. Specifically, for example, this control means controls the opening and closing of a supply valve, which supplies gas, and the heating of the heated body 11, via a direct-current power supply.

By the foregoing, according to the structure of the above-described thin-film deposition apparatus S, it is possible by heating the heated body 11 to promote the decomposition of the first source gas. Additionally, because the temperature itself of the first source gas that was not decomposed or first source gas that recombined after decomposition is raised, there is further promotion of gas decomposition in the space 8. In addition, because the second source gas which is supplied via the second supplying parts 4b without having the second source gas come into contact with the heated body 11 is excited and activated in the space 8, it is possible to perform high-speed film deposition and also form a thin film of high quality, without excessive decomposition of the second source gas.

Also, the thin-film deposition apparatus S may have a constitution in which a plurality of film deposition chambers are connected to a pre-chamber (not shown) having a mechanism for transporting the base member 10 via opening and closing valves that block the flow of the source gas.

Also, in the case of forming a thin-film solar cell with using an apparatus that includes a p-type film deposition chamber, an i-type film deposition chamber, and an n-type film deposition chamber, at least one of the above-noted chambers can have the above-described structure. In particular, by making the deposition chamber for the i-type film, which is required to be a high-quality film, have the above-noted structure, it is possible to improve the productivity and form, for example, a thin-film solar cell having a high photovoltaic conversion efficiency.

<Manufacturing Method>

Next, an example of a method for manufacturing a thin-film solar cell will be described. The process steps indicated below are necessary to manufacture a thin-film solar cell having a photovoltaic conversion layer that includes at least one photoactive layer having a silicon crystalline phase on the base member 10.

First, a base member preparation step is required in which a first electrode 6 that functions as an anode, and a second electrode 2 that: functions as cathode; is provided in opposition to the first electrode 6; and has high-frequency power applied thereto, are placed in the chamber 1, and a base member 10 is disposed between the first electrode 6 and the second electrode 2. In this base member preparation step, the base member 10 is disposed so that the distance between the surface of the base member 10 and the surface of the second electrode 2 that opposes that surface is preferably made at least 5 mm and no greater than 15 mm.

Next, a photoactive layer formation step is required in which, while a silicon-based gas (second source gas) that includes silicon, and hydrogen gas (first source gas) having a flow rate ratio that is at least 25 times and no greater than 58 times that of the silicon-based gas are supplied between the first electrode 6 and the second electrode 2, high-frequency power is applied to the second electrode 2 to generate a plasma between the first electrode 6 and the second electrode 2, so as to form a photoactive layer on the base member 10.

The above-noted photoactive layer formation step, in which the first source gas and the second source gas are supplied to the base member 10 arranged in the above-described thin-film deposition apparatus S so as to generate a plasma in the space 8 and form a film on the base member 10 by the plasma, includes a heating step of heating the heated body 11 for using the heating of the first source gas: a gas supply step of supplying the first source gas and the second source gas; and a film deposition step of generating a plasma in the chamber 1, to which the first source gas and the second source gas are supplied, so as to form a film on the base member 10 disposed in the chamber 1.

In the above-noted photoactive film formation step, the photoactive film is preferably formed with the gas pressure in the chamber 1 at 1000 Pa or greater. In the above-noted photoactive film formation step, a heated catalyzer or a resistance heater or the like is particularly disposed in the flow passage of the first source gas, so as to heat the first source gas by heating the heated body 11 to a temperature below the melting point thereof. In the above-noted photoactive layer formation step, the power density of the high-frequency power may be set in the range from 0.5 W/cm$^2$ to 1.7 W/cm$^2$ for application of high-frequency power to the second electrode 2. Also, in the above-noted photoactive layer formation step, the frequency of the high-frequency power may be set in the range from 13.56 MHz to 40.68 MHz. In the above-noted photoactive layer formation step, the flow rate ratio of the first source gas with respect to that of the second source gas may be adjusted so that the ratio becomes smaller midway in the step than it is at the beginning of the step. Additionally, after the above-noted photoactive layer formation step, the base member 10 may be heated to a temperature from 180° C. to 220° C.

The manufacturing conditions for an i-type microcrystalline silicon film will be described below. Although a microcrystalline silicon film has wavelength sensitivity that extends into the long-wavelength region compared with an amorphous silicon film, similar to crystalline silicon, due to a smaller light absorption coefficient, a thick film thereof must be formed, thereby requiring a high-quality film formed at a higher rate.

As a deposition condition, the pressure during deposition is set to 1000 Pa or higher. The reason for this is that, even when a film is deposited at high speed with the power density of the high-frequency power set to be high, by setting this high-pressure condition, because the electron temperature decreases, it is possible to deposit a film with reduced ion damage. Also, because the first source gas that has had its temperature raised by the heated body 11 is supplied to the space 8, even in the case of a high-pressure condition, high-order silane forming reactions are reduced by the gas heating effect, and it is possible to form a high-quality film at a high rate. The upper limit of the pressure, from the relationship to abnormal discharge and the like, may be approximately 2500 Pa.

By depositing a film with a deposition rate of 1.1 nm is or greater and more preferably 1.4 nm/s or greater, productivity is increased and the manufacturing cost can be reduced.

It is preferable that the flow rate ratio of the first source gas that is hydrogen with respect to the second source gas that is silicon-based gas is preferably at least 25 times and no greater than 58 times (and, in particular, at least 25 times and less than 50 times). By making the rate of dilution of the second source gas by the first source gas low, it is possible to increase the film deposition rate, and because it is possible to reduce the supply of the first source gas as well, it is possible to improve productivity while reducing the manufacturing cost. Also, although crystallization tends to be suppressed if the rate of dilution is made small, the heating of the heated body reduces the recombination of molecular hydrogen, enabling maintenance of a high molecular hydrogen concentration in the chamber, so that it is possible to maintain the required rate of crystallization.

A frequency from 13.56 MHz to approximately 100 MHz is used as the frequency of the high-frequency power applied to the second electrode 2 and, for example, in the case of depositing a film onto a large-area substrate with 1 m² or larger, a frequency of 60 MHz or lower is preferably used. In particular, by making the frequency be 40.68 MHz or lower, it is possible to further reduce the film non-uniformities when depositing onto a base member with a large area. Preferably, frequency of 13.56 MHz or 27.12 MHz is used. Also, by using a power supply with a low frequency, it is possible to reduce the manufacturing cost, and also to improve the productivity because of the ease of accommodating large areas.

It is preferable that the power density of the high-frequency power be at least 0.5 W/cm² and no greater than 2 W/cm², and particularly preferable to make it be at least 0.5 W/cm² and no greater than 1.7 W/cm². Within the above-noted range, ion damage to the film is reduced, enabling a reduction in the loss of film quality, while depositing film at a high rate.

Also, by using a parallel plate type of thin-film deposition apparatus rather than using ladder electrodes or the like, it is possible to reduce the cost of the apparatus, and further, by the above-noted film deposition conditions, it is possible to manufacture a high-quality film at a high rate. By making the distance between the surface of the base member 10 and the surface of the second electrode 2 be at least 5 mm and no greater than 15 mm, it is possible to deposit a film with reduced ion damage.

In a microcrystalline silicon film deposited under the above-noted conditions, it is preferable the Raman peak intensity ratio (crystalline phase peak intensity/amorphous phase peak intensity) in the Raman scattering spectrum be at least 2.5 and no greater than 6. The crystalline phase peak intensity is defined as the peak intensity at 520 cm$^{-1}$ and the amorphous phase peak intensity is defined as the peak intensity at 480 cm$^{-1}$. In this case, the Raman spectrum measurement is performed using, for example, a Ramanscope System 1000, made by Renishaw, which uses a He—Ne laser (wavelength: 632.8 nm) as the excitation light. With the above-noted Raman intensity ratio, from the relationship between the Raman peak surface area ratio and the Raman peak intensity ratio, the crystallization rate of a microcrystalline silicon film is at least 50% and no greater than 70%.

Also, by making the gas pressure be 1000 Pa or greater, even if the heating temperature of the heated body 11 is made a low temperature of 400° C. or greater and no greater than 1000° C., and if the $H_2/SiH_4$ gas flow rate ratio is made 50/1 or lower, the crystallization rate is made approximately 50 to 70%.

Because a thin-film solar cell formed using the above-noted method is formed from a high-quality film made at a high speed, it is possible to increase the productivity and form a thin-film solar cell having a high conversion efficiency.

Figure 4:
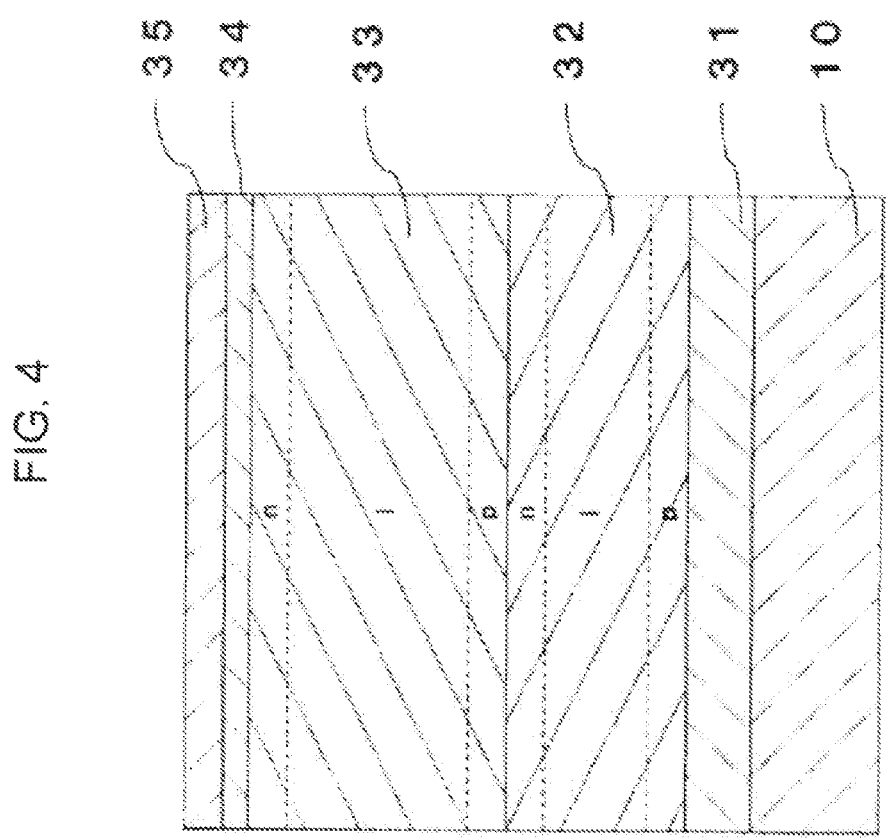
FIG. 4 is a schematic cross-sectional view showing an example of a thin-film solar cell manufactured by the method for manufacturing a thin-film solar cell according to the present invention.

An example of a thin-film solar cell that is manufactured will be described below, using FIG. 4. A first conductive layer 31 made of an electrically conductive material having translucency, such as $SnO_2$, ITO, or ZnO, is formed on a base member 10 that has translucency, made of glass, plastic, resin or the like. The film thickness of the first conductive layer 21 is approximately 100 nm to 1 μm.

Next, a first photovoltaic conversion layer 32, in which an i-type semiconductor layer functions as a photoactive layer and which is made of an amorphous semiconductor such as amorphous silicon or the like and has an internal pin junction is formed on the first conductive layer 31, and a second photovoltaic layer 33, in which an i-type semiconductor layer functions as a photoactive layer, which is made of a microcrystalline semiconductor such as microcrystalline silicon or the like, and which has an internal pin junction is formed thereon. With first p-type and n-type layers of the first photovoltaic conversion layer 32 each being approximately 5 to 30 nm, the film thickness of the first i-type semiconductor layer is made approximately 200 nm to 1 μm, and with the second p-type and n-type layers of the second photovoltaic conversion layer 33 each being approximately 5 to 30 nm, the film thickness of the second i-type semiconductor layer is made approximately 1 to 5 μm.

Next, a second conductive layer 34 made of an electrically conductive material having translucency, such as $SnO_2$, ITO, or ZnO or the like is formed on the second photovoltaic conversion layer 33. Additionally, a third conductive layer 35 made of a material such as silver or the like that has a high reflectivity with respect to light is formed on the second conductive layer 34. With the film thickness of the second conductive layer 34 being approximately 5 nm to 2 μm, the film thickness of the third conductive layer 35 is made approximately 100 to 500 nm. Also, either one of the second conductive layer 34 or the third conductive layer 35 may be formed. For example, the second conductive layer 34 may be formed by a metal material such as silver or the like.

The present embodiment can be applied not only to the tandem structure noted above, but also to a triple structure thin-film solar cell that is constituted by the lamination of a semiconductor made of an amorphous silicon film, a semiconductor made of an amorphous silicon-germanium film, and a semiconductor made of a microcrystalline silicon film, or of a semiconductor made of amorphous silicon film, a semiconductor made of a microcrystalline silicon film, and a semiconductor made of a microcrystalline silicon-germanium film.

If this is done, by forming at least the microcrystalline silicon film, which needs to be formed with as a thick film, by the above-noted manufacturing method, it is possible to increase productivity and fabricate a thin-film solar cell having a high conversion efficiency.

Also, the above-noted method for manufacturing film may be divided into two process steps, the flow rate of the first source gas with respect to the second source gas being less in the latter half of film deposition than in the former half of film deposition. By making the rate of dilution of the second source gas by the first source gas low, it is possible to accelerate the film deposition rate and increase the conversion efficiency. This can be considered as a result of reducing the increase in the crystallization rate in the latter half of the film by intentionally making the dilution rate low because the crystallization rate of a microcrystalline film is not always constant, but increases in the latter half of the film deposition under constant dilution conditions. Compared with the start of the film deposition, the dilution rate at the end of the film deposition can be made approximately 3 to 15% of the dilution rate at the start of film deposition.

After forming the first conductive layer, the photovoltaic conversion layer, and the second conductive layer (third conductive layer) on the base member, heating may be done to a temperature of 180° C. or greater and no greater than 220° C. That is, heat treatment is performed after the thin-film solar cell is formed. Performing heat treatment can further increase the conversion efficiency. This is because the conductivity of the p-type semiconductor layer and the n-type semiconductor layer of the photovoltaic conversion layer is improved and the activated energy increases, so that the open-circuit voltage improves. Additionally, this can be inferred that, hydrogen within the film migrates to stable sites by the heat treatment, thereby reducing hydrogen-induced defects in the film including the i-type semiconductor layer. The heat treatment time may be performed for approximately 15 to 90 minutes. For example, with respect to a thin-film solar cell made by the above-noted manufacturing method and having a conversion efficiency before heat treatment of approximately 11 to 11.2%, the conversion efficiency after heat treatment is improved to approximately 12 to 13% by performing the heat treatment under conditions of the above-noted temperature and heat treatment time.

Next, a further preferable example of the manufacturing method will be described. The parts that are duplications of process steps in the above-described method will be omitted. In the gas supplying step, the first source gas is preferably supplied before supplying the second source gas. In the heated body 11 heating step, the base member 10 may be disposed in the chamber 1. After the film deposition step, there may be an evacuation step in which the supply of the first source gas and the second source gas is stopped and the inside of the chamber 1 is evacuated, and a cooling step in which the heated body 11 is cooled. In the evacuation step, the supply of the second source gas may be stopped before the stopping of the supply of the first source gas. In the cooling step, the base member 10 may be taken outside the chamber 1. In the heating step, if the heated body 11 is made of a heated catalyzer, the heated body 11 may be heated to 800° C. or higher. In the evacuation step, if the heated body 11 is made of a heated catalyzer, the heated body 11 is heated to 800° C. or higher.

Specifically, in the thin-film deposition apparatus S shown in FIG. 1, the following process steps 1 and 2 are preferably performed before generating a plasma for the purpose of forming a thin film between the first electrode 6 and the second electrode 2.

Process step 1 (heating step): With the inside of the chamber 1 evacuated (1 Pa or lower and preferably 0.1 Pa or lower), the heated body 11 made of a heated catalyzer is heated to 800° C. or higher.

Process step 2 (gas supplying step): The first source gas (hydrogen gas) and the second source gas (for example, silane) are supplied to the inside of the chamber 1 from the first supplying parts 4a and the second supplying parts 4b, respectively, and the pressure within the chamber 1 is adjusted to a prescribed value. In this case, if the temperature of the heated body 11 does not reach a prescribed value necessary for the forming of a thin film, the heated body 11 is further heated.

In the case of using a silicon-based gas such as silane as the second source gas, by the first source gas being supplied to within the chamber 1 before the second source gas in the process step 2, because it is possible to reduce the reverse flow of the second source gas in the first introduction path 3a, it is possible to reduce the deterioration of the heated body 11 accompanying contact with the second source gas.

With the inside of the chamber 1 adjusted to the prescribed pressure, high-frequency power is applied to the second electrode 2 to generate a plasma, so as to excite and activate the source gas, and form a thin film having a prescribed film thickness on the base member 10. After that, the process steps 3 and 4 noted below are performed in sequence.

Process step 3 (evacuation step): With the heated body 11 made of a heated catalyzer heated to 800° C. or higher, the supply of the first source gas and the second source gas is stopped, and the source gas within the chamber 1 is sufficiently exhausted.

Process step 4 (cooling step): The heated body 11 is cooled with the inside of the chamber 1 in the vacuum condition.

If a heated catalyzer made of, for example, Ta (tantalum) or W (tungsten) is used as the heated body 11, it is thought that, because the heated catalyzer absorbs hydrogen component such as hydrogen molecules and hydrogen atoms in the source gas and the hydrogen component forms a hydride at crystal grain boundaries, the phenomenon of the crystal grain boundaries tending to become ruptured, that is, hydrogen embrittlement, occurs. According to the above-noted process steps 1 and 2, because the hydrogen gas of the first source gas is supplied to inside the chamber 1 in the condition in which the heated body is heated, the absorption of hydrogen into the heated body is reduced. In particular, since the hydrogen gas is supplied in the condition in which the heated body is heated to 800° C. or higher, there is almost no absorption of hydrogen into the heated body and, in addition, this is a temperature region in which a hydride forming reaction is difficult to occur. For this reason, deterioration of the heated body by hydrogen embrittlement is greatly reduced. Hydrogen embrittlement is effectively avoided in process steps 3 and 4 as well.

Also, if a silicon-based gas such as silane is used as the second source gas, because the supply of the second source gas is stopped before the supply of the first source gas in the process step 3, it is possible to reduce the reverse flow of the second source gas in the first introduction path 3a. By doing this, it is possible to reduce the deterioration of the heated catalyzer accompanying contact with the second source gas.

By providing the thin-film deposition apparatus S with a pre-chamber (not shown) connected to the chamber 1, it is possible to transport the base member 10 into and out of the chamber 1 without placing the inside of the chamber 1 at the atmospheric pressure. When forming a thin film on the base member 10, the base member 10 is transported from the pre-chamber into the inside of the chamber 1 after the inside of the pre-chamber and inside of the chamber 1 shown in FIG. 1 is placed in the vacuum condition. Also, after the forming of the thin film thereon, the base member 10 is transported from the chamber 1 after the inside of the pre-chamber and the inside of the chamber 1 reach the vacuum condition.

In this case, it is preferable that, in the process step 1, the heated body 11 is heated so that there is a time overlap with the operation of transporting the base member 10 into the chamber 1. It is also preferable that, in the process step 4, the heated body 11 is cooled so that there is a time overlap with the operation of transporting the base member 10 out from the chamber 1. With this, because there is a shortening of time, it is possible to further improve the productivity.

Although the addition of the time for heating and cooling the heated body 11 with the inside of the chamber 1 in the vacuum condition lengthens the processing time required to form the thin film, because, as described above, the steps of heating and cooling the heated body 11 are performed with a time overlap with the operations of transporting the base member 10 into and out of the pre-chamber, the effective time required for formation of the thin film is shortened, thereby enabling maintenance of productivity. Also, it is not absolutely necessary to heat and cool the heated body 11; it can be maintained at a temperature of 800° C. or higher at all times.

Next a preferable example of the case of forming a hydrogenated amorphous film will be described. When forming a hydrogenated amorphous silicon film, $H_2$ gas and $SiH_4$ gas are supplied to the first introduction path 3a and the second introduction path 5, respectively. The gas pressure is set to 50 to 700 Pa, the $H_2/SiH_4$ gas flow rate ratio is set in the range from 2/1 to 40/1, and the high-frequency power density is set in the range from 0.02 to 0.2 W/cm$^2$.

With the manufacturing method of the present embodiment, the first source gas that has had its temperature raised by the heated body 11 is supplied to the space 8. For this reason, high-order silane producing reactions occurring in the space 8 due to the gas heating effect are suppressed, enabling promotion of crystallization of microcrystalline silicon film and film deposition at a high speed.

If the flow rate of $SiH_4$ gas is very low compared to the $H_2$ gas, a part of the $H_2$ gas (first source gas) supplied to the first introduction path 3a is divided and supplied to the second supply path 3b, so that it is possible to increase the overall flow rate of gas supplied from the second supplying parts 4b. By doing this, the gas pressure (total pressure) within the second supply path 3b becomes large, so that the $SiH_4$ gas is uniformly sprayed from a plurality of second supplying parts 4b, thereby enabling achievement of uniform film deposition.

<Variation Example of Manufacturing Method>

Figure 5:
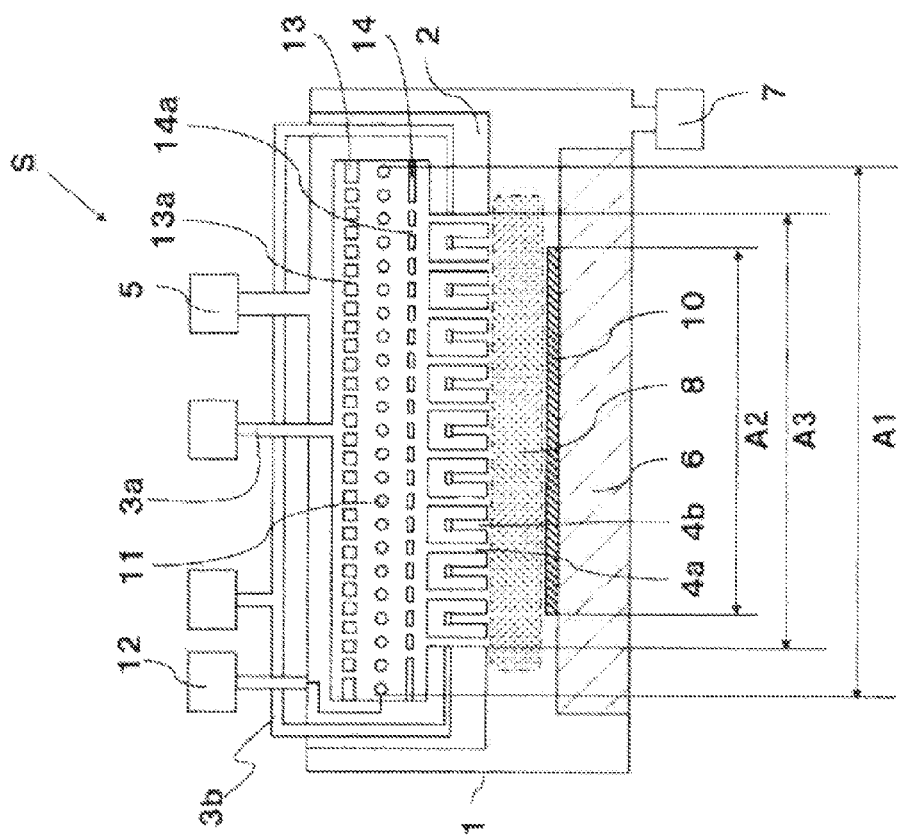
FIG. 5 is a schematic cross-sectional view showing an example of a thin-film deposition apparatus used in the method for manufacturing a thin-film solar cell according to the present invention.

Next, a variation example of the manufacturing method will be described. As shown in FIG. 5, in the thin-film deposition apparatus S, the space A1 occupied by the heated body 11 may be made larger than the thin-film formation region A2 of the base member 10. By adopting the above-noted constitution, the first source gas that is heated by the heated body 11 maintains its temperature as it is uniformly supplied to the base member 10. If the region A1 is smaller than the region A2, because the spatial occupancy density of the heated body 11 is small at the periphery of the heated body 11, it is difficult to efficiently heat the first source gas. Additionally, because of the contact of the first source gas, the temperature of which is raised, with the first source gas outside the region and the inner wall of the first introduction path 3a, heat is lost, causing the temperature to decrease, so that it becomes more difficult to obtain a sufficient gas heating effect, the closer the position is to the outer peripheral region of the heated body 11.

However, in the case of the above constitution, in which the region A1 occupied by the heated body 11 is smaller than the thin-film formation region A2 on the base member 10, because the first source gas is maintained at a sufficiently high temperature as it is uniformly supplied over the base member 10, the quality of the thin film formed over the surface of the base member 10 becomes uniform, and it is possible to form a thin-film solar cell having a uniform distribution of photovoltaic conversion characteristics.

The region A3 occupied by the first supplying parts 4a may be made the same or smaller than the region A1 occupied by the heated body 11, and larger than the thin-film formation region A2 on the base member 10. By adopting this constitution, because it becomes difficult for the first source gas 1 having a low temperature in the peripheral region of the heated body 11 and in the vicinity thereof to be supplied to the space 8, there is a further improvement in the uniformity of the temperature of the first source gas supplied over the surface of the base member 10, so that the quality of the thin film is made uniform. By doing this, it is possible to form a thin-film solar cell having a uniform distribution of photovoltaic conversion characteristics.

Figure 6:
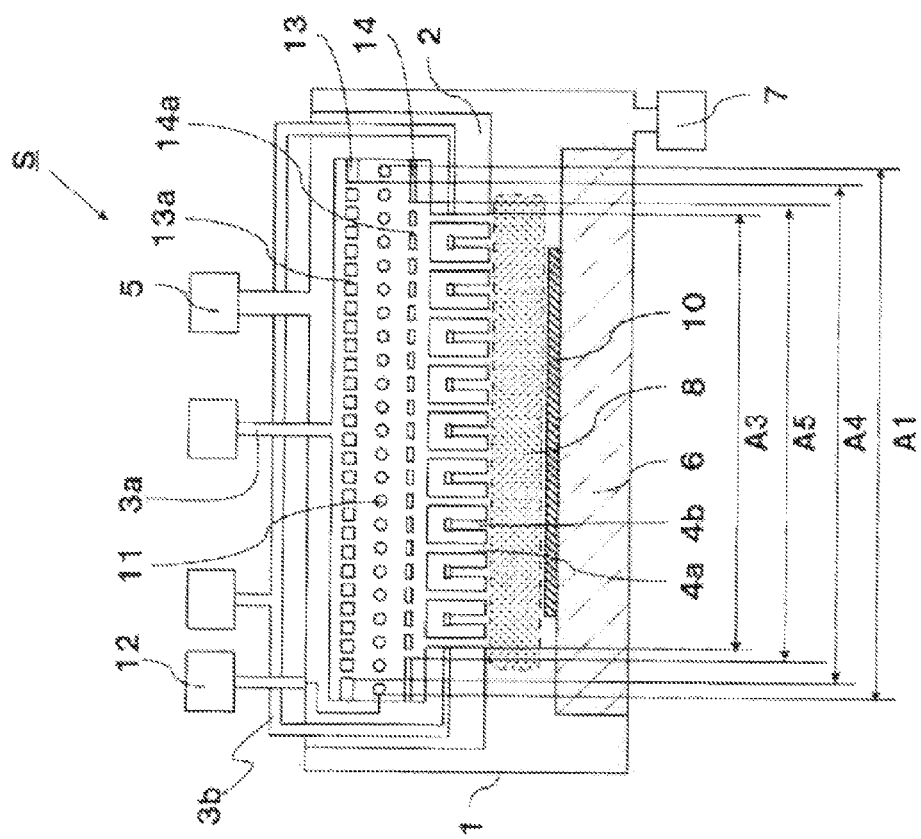
FIG. 6 is a schematic cross-sectional view showing an example of a thin-film deposition apparatus used in the method for manufacturing a thin-film solar cell according to the present invention.

Also, by providing a distribution plate 13 at the up-stream side of the heated body 11, it is possible to cause the first source gas to uniformly contact the heated body 11, thereby enabling efficient uniform heating of the first source gas. In this case, as shown in FIG. 6, first aperture parts 13a may be provided in the distribution plate 13 for the purpose of passing the first source gas, and the region A4 occupied by the first aperture parts 13a may be made smaller than the region A1 occupied by the heated body 11, and larger than the region A3 occupied by the first supplying parts 4a. By adopting the above-noted constitution, the first source gas introduced from the first aperture parts 13a is efficiently heated by the heated body 11, and when the first source gas flows toward the inner wall side of the first introduction path 3a, the time during which the first source gas is in contact with the heated body 11 lengthens, making a possibility higher to maintain the high temperature of the first source gas.

It is preferable that a radiation blocking member 14 be provided so as to cover the first supplying parts 4a on the downstream side of the heated body 11, so that radiated heat does not reach the base member 10 directly. When this is done, it is preferable that the radiation blocking member 14 have the function of acting as a reflecting plate to cause reflection of radiation from the heated body 11.

Also, as shown in FIG. 6, second aperture parts 14a are provided on the radiation blocking member 14 for the purpose of passing the first source gas. The region A5 occupied by the second aperture parts 14a may be made the same as or smaller than the region A1 occupied by the heated body 11, and larger than the region A3 occupied by the first supplying parts 4a. By the above-noted constitution, in the same manner as above, because it becomes difficult for the first source gas 1 having a low temperature in the peripheral region of the heated body 11 and in the vicinity thereof to be supplied to the space 8, there is a further improvement in the uniformity of thin film formed over the surface of the base member 10, enabling the formation of a thin-film solar cell having a uniform distribution of photovoltaic conversion characteristics.

Figure 7:
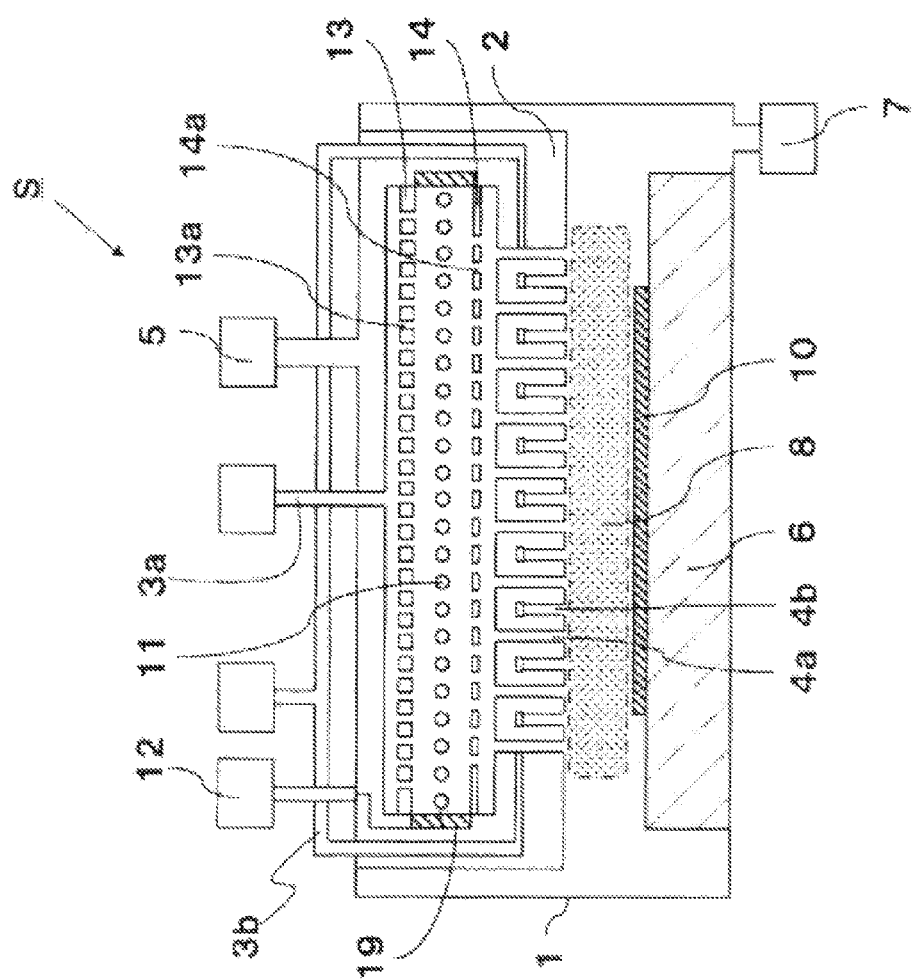
FIG. 7 is a schematic cross-sectional view showing an example of a thin-film deposition apparatus used in the method for manufacturing a thin-film solar cell according to the present invention.

Also, as shown in FIG. 7, end part heated bodies 19 may be provided on the peripheral part of the first introduction path 3a on which the heated body 11 is provided. By raising the temperature of the inner wall of the first introduction path 3a, it is possible to reduce the decrease in temperature when the first source gas that had had its temperature raised by the heated body 11 at the inner wall of the first introduction path 3a, and in the same manner as above it becomes difficult for the first source gas 1 having a low temperature to be supplied to the space 8, so that there is a further improvement in the uniformity of the thin film formed over the surface of the base member 10, thereby enabling the formation of a solar cell with uniform photovoltaic conversion characteristics. A heated body such as a sheathed heater or the like or heat-exchanging piping that circulates high temperature fluid such as a gas, a liquid or the like may be used as the end part heated body 19. The temperature of the end part heated body 19 is preferably at least 200° C. and no greater than 500° C.

Figure 8:
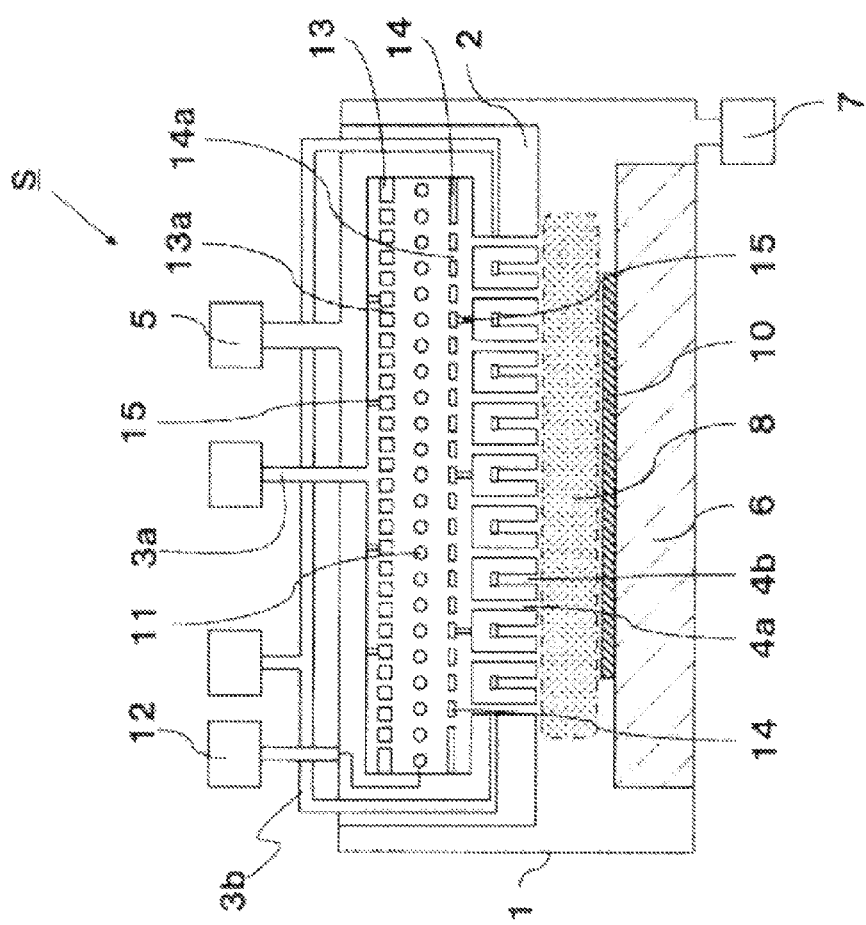
FIG. 8 is a schematic cross-sectional view showing an example of a thin-film deposition apparatus used in the method for manufacturing a thin-film solar cell according to the present invention.

Also, as shown in FIG. 8, it is preferable that each of the distribution plate 13 and the radiation blocking member 14 includes a plurality of supporting members 15 mounted to the first introduction path 3a perpendicularly with respect to the plane of each of the members. In particular, by providing supporting members 15 in the center region of the distribution plate 13 and the radiation blocking member 14, it is possible to reduce the warping of the distribution plate 13 and the radiation blocking member 14 accompanying a rise of the heated body 11 to a high temperature, thereby enabling maintenance of the uniformity of the flow of gas passing through the distribution plate 13 and the radiation blocking member 14.

Also, the distribution plate 13 and the radiation blocking member 14 may be sub-divided into a number of parts and fixed by means of the supporting members 15. By sub-dividing the distribution plate 13 and the radiation blocking member 14 in this manner, it is possible to make the amount of warping per part of the distribution plate 13 and the radiation blocking member 14 accompanying the rise of the heated body 11 to a high temperature small, thereby enabling the maintenance of the uniformity of the flow of gas passing through the distribution plate 13 and the radiation blocking member 14.

Figure 9:
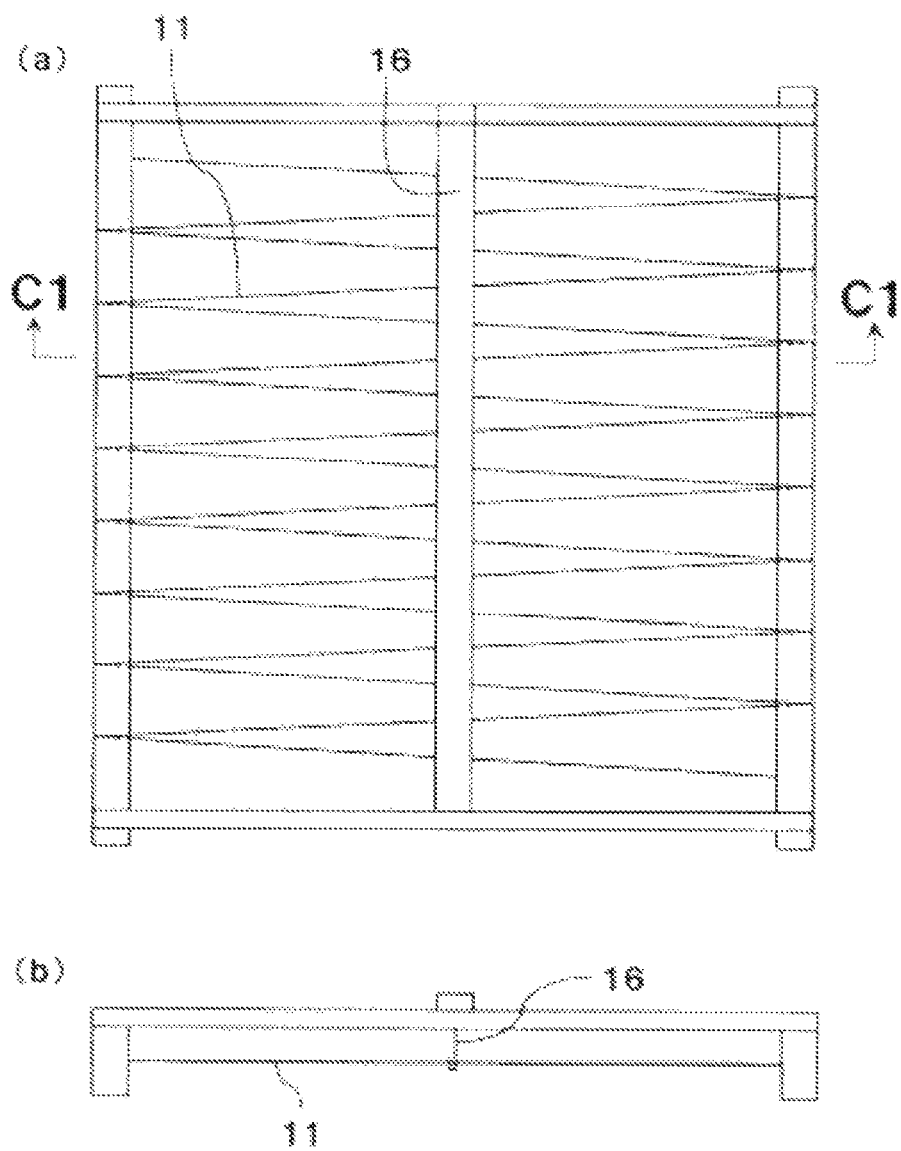
FIG. 9 is a drawing schematically showing an example of the structure of a heated body used in the method for manufacturing a thin-film solar cell according to the present invention, (a) being a plan view and (b) being a cross-sectional view cut along the direction of line C1-C1 in (a).
Figure 10:
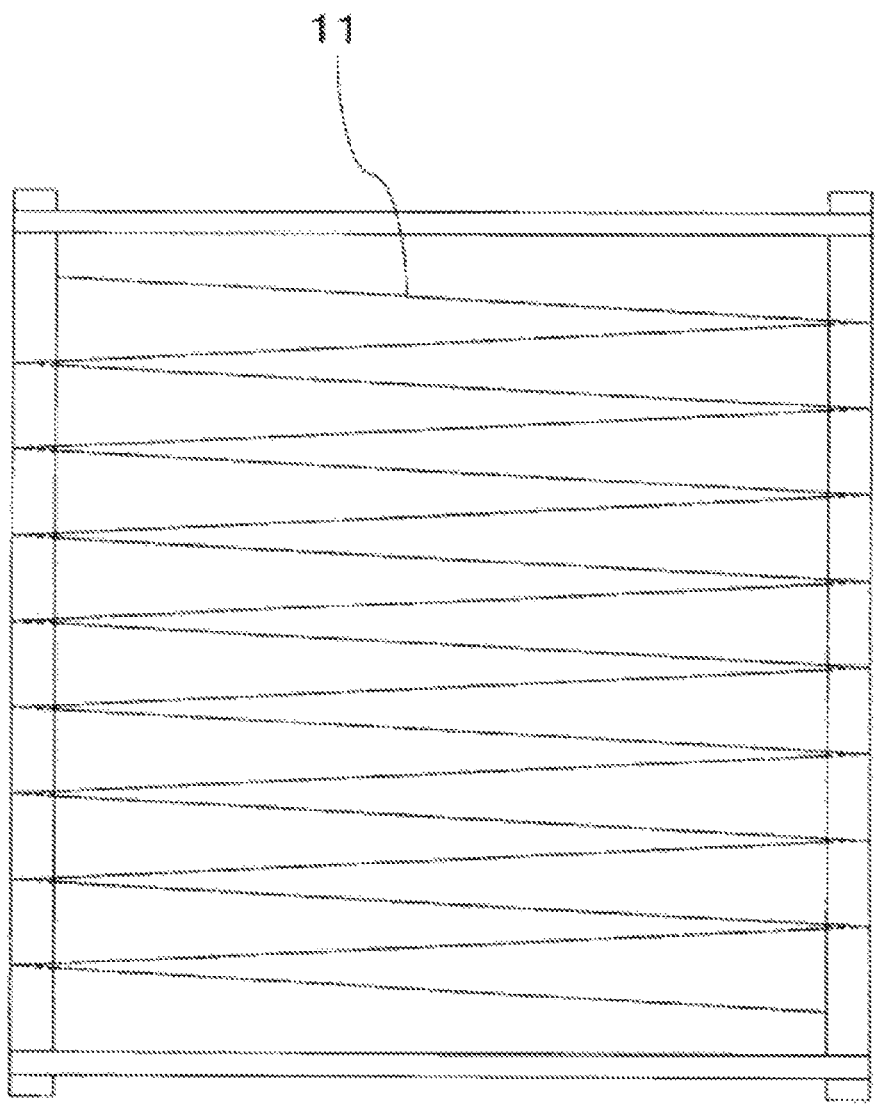
FIG. 10 is a plan view showing, in schematic form, an example of the structure of a heated body used in the method for manufacturing a thin-film solar cell according to the present invention.

Also, in the case in which the heated body 11 made of a heated catalyzer having a wire shape is used as shown in FIG. 9, a supplementary member 16 that supports the heated body may be provided midway in the heated body 11 that is installed from one end to the other end. In particular, by providing a supplementary member 16 at the center part of the heated body 11 that is installed from one end to the other end, in contrast to a heated body 11 as shown in FIG. 10 that does not have a supplementary member 16, because it is possible to reduce the possibility of a heated body 11 that has elongated because of repeated use coming into contact with the first introduction path 3a, or adjacent heated bodies 11 coming into contact with one another, it is possible to reduce the frequency of replacing the heated body 11, and improve the productivity. It is also possible to reduce the possibility of non-uniformity of the quality of the thin film formed over the surface of the base member 10 caused by a distribution of heating of the first source gas because of elongation deformation of the heated body 11.

Figure 11:
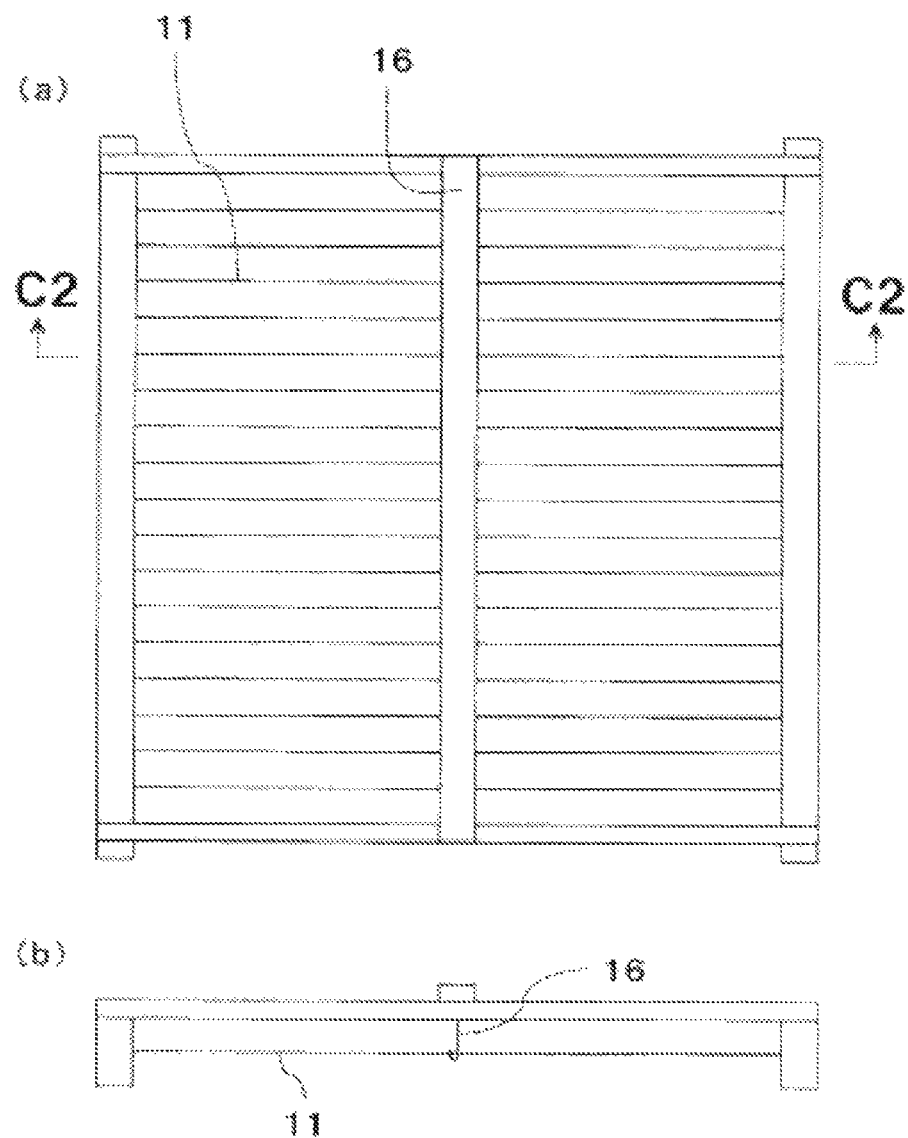
FIG. 11 is a drawing schematically showing an example of the structure of a heated body used in the method for manufacturing a thin-film solar cell according to the present invention, (a) being a plan view and (b) being a cross-sectional view cut along the direction of line C2-C2 in (a).

Although in FIG. 9 one folded over heated body 11 is shown disposed as a heated body 11 over a certain region, a plurality of heated bodies 11 that are disposed from one end to the other end without being folded over, may be provided as shown in FIG. 11.

Alternatively, as shown in FIG. 12(*a*), a heated body 11 that extends from one end may be made to fold back thereto at a supplementary member 16 provided in the center part and extend again to the one end, and a heated body 11 that extends from the other end may be made to fold back thereto at the supplementary member 16 provided in the center part and extend again to the other end.

Additionally, as shown in FIG. 12(*b*), a plurality of supplementary members 6 may be provided.

Figure 13:
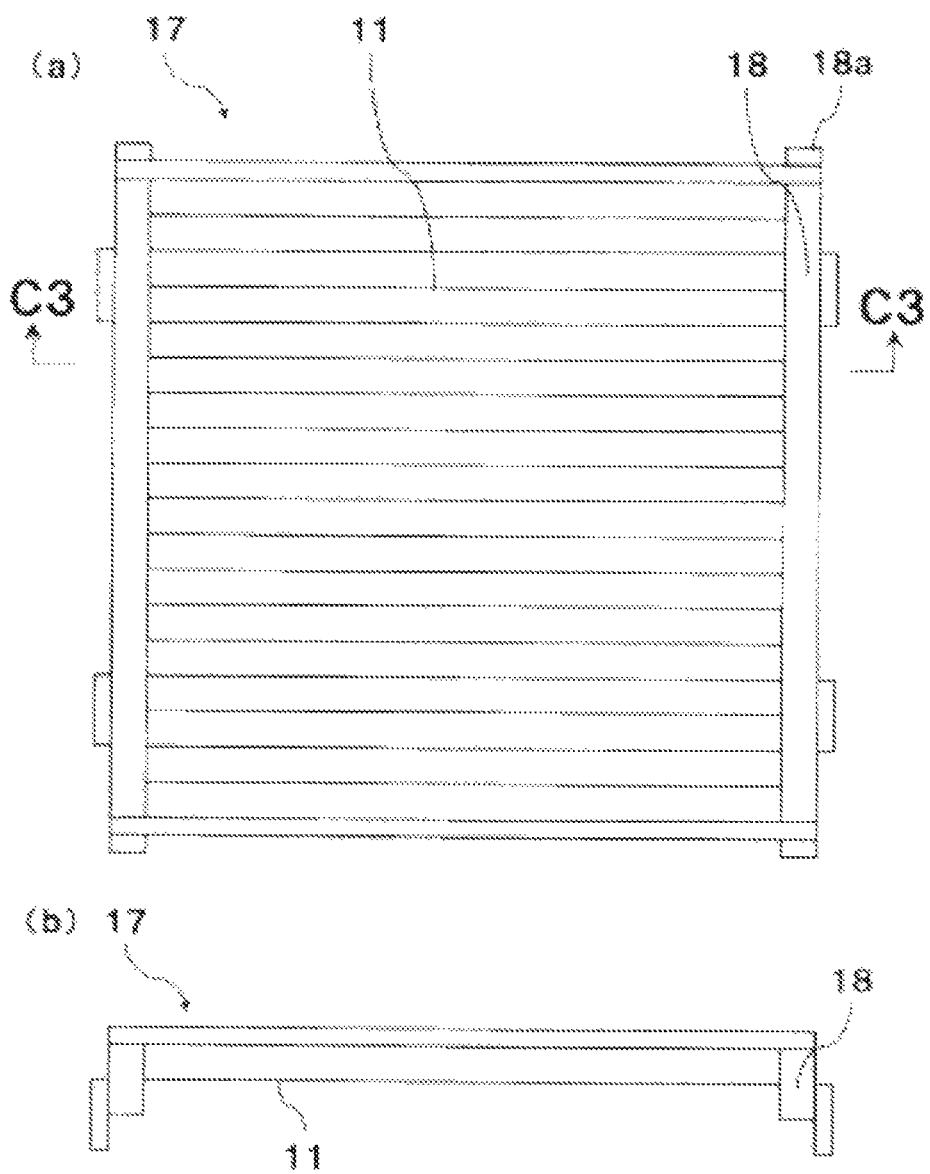
FIG. 13 is a drawing schematically showing an example of the structure of a heated body used in the method for manufacturing a thin-film solar cell according to the present invention, (a) being a plan view and (b) being a cross-sectional view cut along the direction of line C3-C3 in (a).

Also, as shown in FIG. 13, a heated body mechanism 17 may be provided that includes a heated body 11 provided on a support frame 18 that can move in the horizontal direction.

Figure 14:
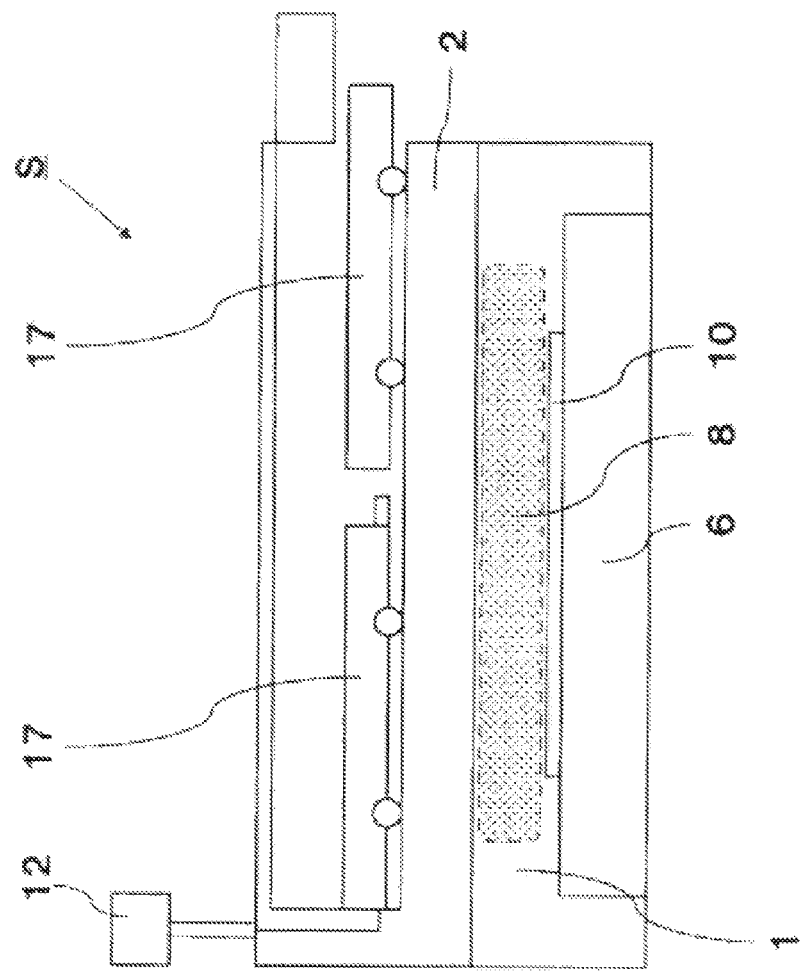
FIG. 14 is a schematic cross-sectional view showing an example of the thin-film deposition apparatus used in the method for manufacturing a thin-film solar cell according to the present invention.

Also, as shown in FIG. 14, the heated body mechanism 17 may be made to be movable between inside and outside of the apparatus from the side of the thin-film deposition apparatus S. By doing this, it is possible to simplify the task of replacing the heated body 11, thereby enabling an improvement in productivity. In this case, the supply of electrical power to the heated body 11 can be done by supplying electrical power to the heated body 11 via a power line within the support frame 18. Also, even if a plurality of heated body mechanisms 17 are provided, a joining part 18a can be provided on the support frame 18 to mutually join the heated body mechanisms 17 and, by having the joining parts function so as to pass electricity, it is possible for one heated body mechanism connected to the heating power supply 12 to supply electrical power to another heated body mechanism 17.

Figure 15:
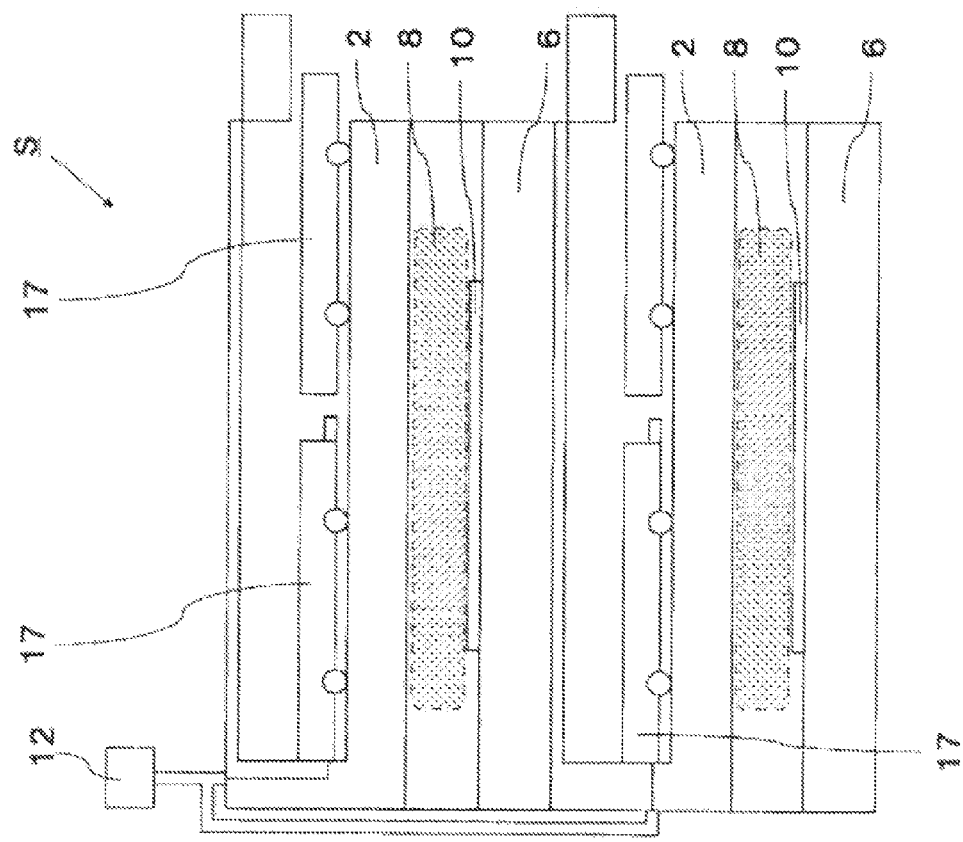
FIG. 15 is a schematic cross-sectional view showing an example of the thin-film deposition apparatus used in the method for manufacturing a thin-film solar cell according to the present invention.

Additionally, as shown in FIG. 15, in the case in which a plurality of film deposition regions are provided in the vertical direction, by using a heated body mechanism 17 positioned on a lower level that can move in the horizontal direction, it is possible to simplify the task of replacing the heated body 11, thereby improving the productivity.

Example 1

Next, a specific example of the present embodiment will be described.

A first conductive layer made of an $SnO_2$ film having a thickness of 800 nm was formed on a glass substrate, using thermal CVD. Then, using the thin-film deposition apparatus S shown in FIG. 1, a first photovoltaic conversion layer was formed on the first conductive layer. The first photovoltaic conversion layer was formed by successively laminating a p-type, an i-type, and an n-type amorphous silicon film, on which an n-type microcrystalline silicon film was laminated. In this case, the i-type amorphous silicon film thickness was made 250 nm.

Next, a second photovoltaic conversion layer was formed on the first photovoltaic conversion layer. The second photovoltaic conversion layer was laminated by successive lamination of a p-type and an i-type microcrystalline silicon film, on which an n-type amorphous silicon film was laminated. In this case, the i-type microcrystalline silicon film thickness was made 2.5 µm. Silane gas and hydrogen gas were used as the source gases. As doping gases, $B_2H_6$ (diborane) was used for the p-type semiconductor layer, and $PH_3$ (phosphine) was used for the n-type semiconductor layer.

Additionally, sputtering method was used to laminate onto the second photovoltaic conversion layer a second conductive layer made of a ZnO film having a thickness of 10 nm, and a third conductive layer made of a silver having a thickness of 300 nm. In this case, a heated catalyzer made of tantalum wire was heated to 1500° C. and heated hydrogen gas for only the fabrication of the i-type microcrystalline silicon film, and the heated catalyzer was not heated for the other films. Heating of the heated body 11 was not done for any of No. 14 through No. 21 in Table 1, which are comparison examples.

The film deposition conditions shown in Table 1 were used to deposit i-type microcrystalline silicon films. The temperature of the glass substrate was adjusted to 190° C. The distance between the glass substrate and the second electrode 2 was made 6 mm. The photovoltaic conversion efficiencies of the thin-film solar cells manufactured under each of the conditions were measured, the results being shown in Table 1, and the relationship between the deposition rate and the conversion efficiency for No. 1 to No. 13 and for the comparison examples No. 14 to No. 21 in Table 1 is shown in FIG. 16.

TABLE 1

| No. | Pressure (Pa) | Gas flow rate ratio (silane/hydrogen) | High-frequency power supply Frequency (MHz) | High-frequency power supply Power density (W/cm²) | Deposition Rate (nm/s) | Conversion efficiency (%) |
|---|---|---|---|---|---|---|
| 1 | 1000 | 1/40 | 27.12 | 1.17 | 1.41 | 12.25 |
| 2 | 1000 | 1/37 | 27.12 | 1.17 | 1.52 | 12.14 |
| 3 | 1300 | 1/58 | 27.12 | 0.69 | 1.12 | 12.64 |
| 4 | 1300 | 1/50 | 27.12 | 0.96 | 1.40 | 12.51 |
| 5 | 1300 | 1/42 | 27.12 | 1.00 | 1.55 | 12.29 |
| 6 | 1300 | 1/41 | 27.12 | 1.12 | 1.72 | 12.13 |
| 7 | 1300 | 1/39 | 27.12 | 1.17 | 1.82 | 11.70 |
| 8 | 1800 | 1/41 | 27.12 | 1.22 | 1.51 | 13.78 |
| 9 | 1800 | 1/35 | 27.12 | 1.44 | 1.72 | 13.49 |
| 10 | 1800 | 1/29 | 27.12 | 1.70 | 2.00 | 12.89 |
| 11 | 1800 | 1/25 | 27.12 | 2.00 | 2.47 | 12.25 |
| 12 | 1300 | 1/41 | 13.56 | 1.12 | 1.35 | 12.42 |
| 13 | 1300 | 1/41 | 40.68 | 1.12 | 1.92 | 11.67 |
| 14 | 800 | 1/56 | 27.12 | 0.53 | 0.78 | 12.52 |
| 15 | 800 | 1/50 | 27.12 | 0.62 | 0.87 | 11.18 |
| 16 | 800 | 1/39 | 27.12 | 0.74 | 1.42 | 7.43 |
| 17 | 1300 | 1/50 | 27.12 | 1.06 | 1.48 | 10.93 |
| 18 | 1300 | 1/44 | 27.12 | 1.17 | 1.66 | 10.71 |
| 19 | 1300 | 1/41 | 27.12 | 1.33 | 1.84 | 10.02 |
| 20 | 1800 | 1/32 | 27.12 | 1.91 | 1.95 | 9.40 |
| 21 | 800 | 1/50 | 27.12 | 0.55 | 0.98 | 12.16 |

Figure 16:
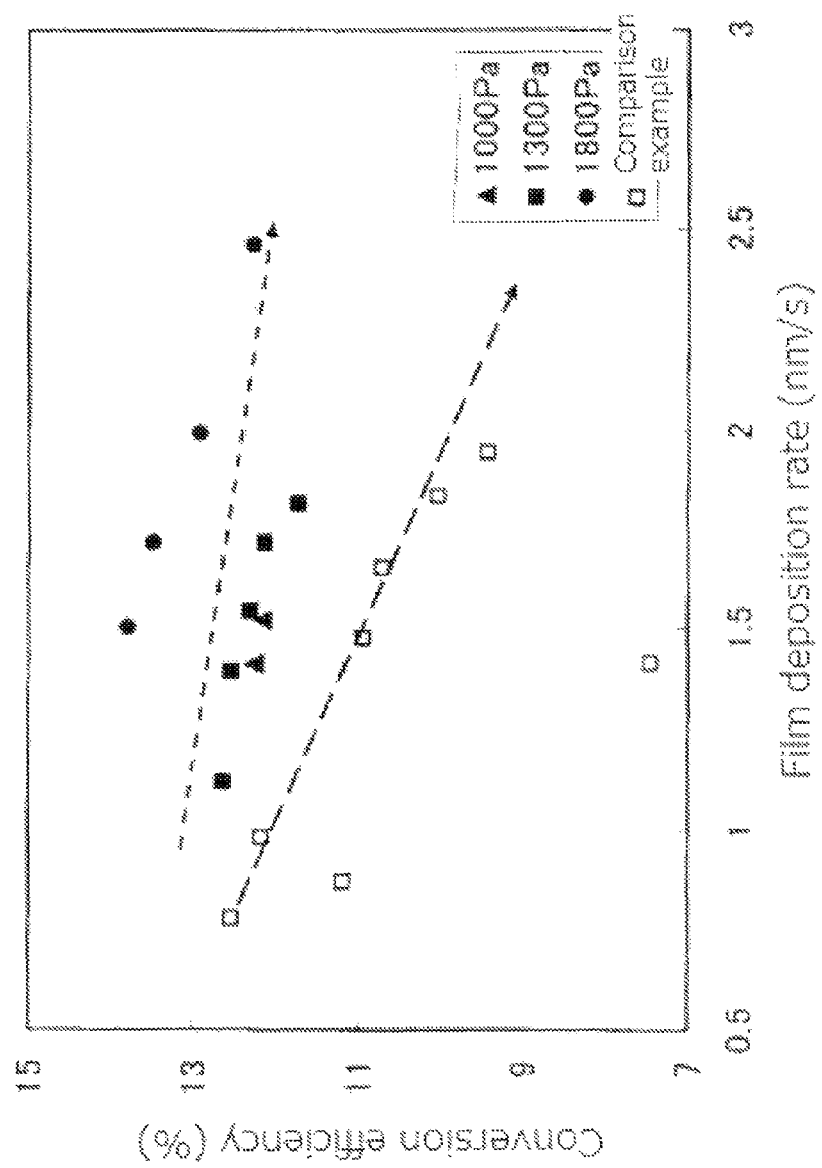
FIG. 16 is a diagram describing the results of examples, showing a graph of the relationship between the film deposition rate and the conversion efficiency.

From the results of Table 1 and FIG. 16, it was verified that, by depositing films with the source gas heated by the heated body 11 and under high-pressure conditions of 1000 Pa or greater, it was possible to form thin-film solar cells at a high speed and with a high conversion efficiency.

It was also verified that, even if the frequency was 40.68 MHz or lower, a thin-film solar cell with high conversion efficiency is formed at a deposition rate of 1.1 nm/s or greater.

It was additionally verified that, by heating the source gas using the heated body 11, compared with the comparison examples No. 14 to No. 21, even if the dilution rate of the silicon-based gas by the hydrogen gas is made small, a thin-film solar cell is formed at a high speed and with a high conversion efficiency.

Also, with regard to the thin-film solar cells manufactured under conditions No. 6 and No. 8 to No. 10 in Table 1, the Raman peak intensity ratio, which is the ratio of (crystalline phase peak intensity/amorphous phase peak intensity) in the Raman scattering spectrum of the microcrystalline silicon films were measured. The results are shown in Table 2.

TABLE 2

| No. | Raman peak intensity ratio I (520)/I (480) |
|---|---|
| 6 | 5.32 |
| 8 | 5.05 |
| 9 | 5.14 |
| 10 | 2.85 |

As shown in Table 2, it was verified that the Raman peak intensity ratio is 2.85 or greater and no greater than 5.32, which is 2.5 or greater and no greater than 6.

Next, in the thin-film solar cells manufactured under the conditions No. 9 and No. 10 in Table 1, the film deposition rates when the distance between the glass substrate and the second electrode was varied from 6 mm to 8 mm and 10 mm were verified. The results are shown in FIG. 17.

Figure 17:
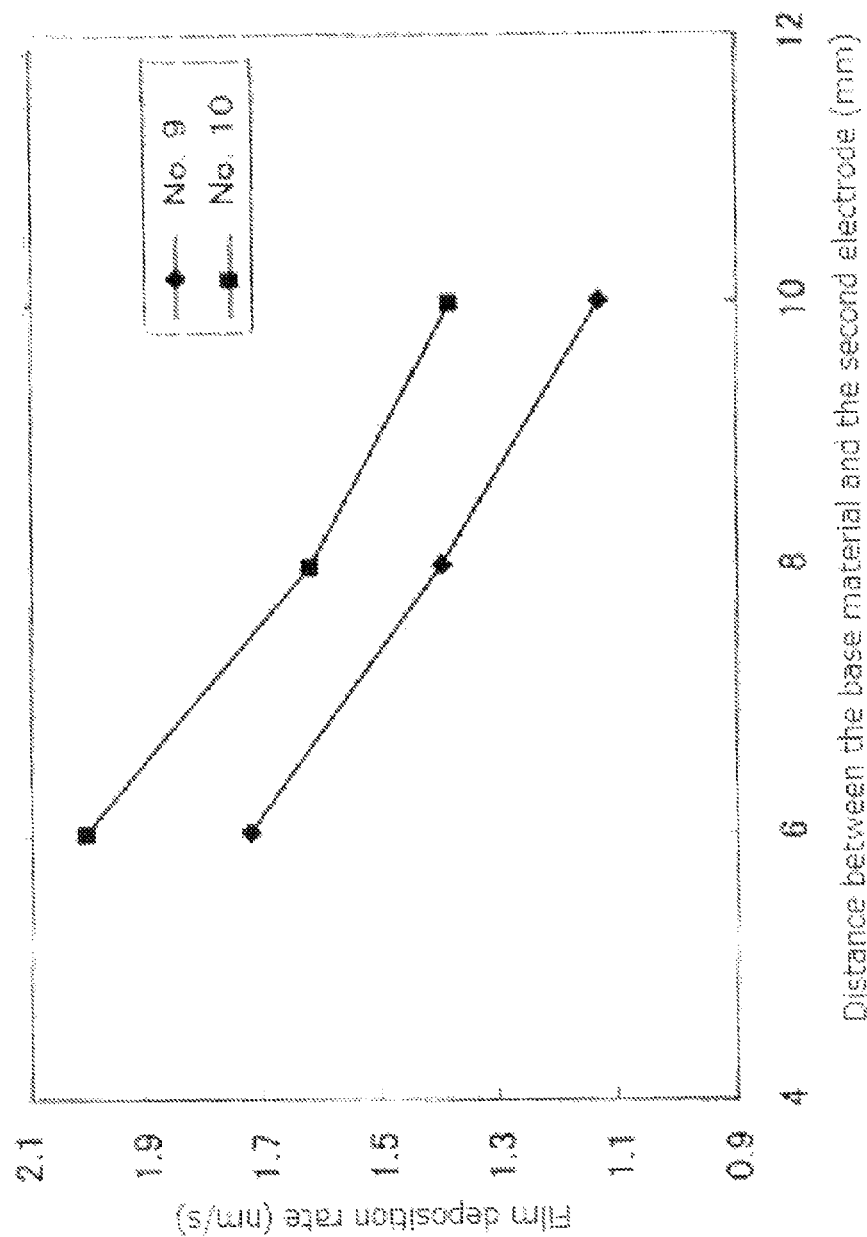
FIG. 17 is a diagram describing the results of examples, showing a graph of the relationship between the distance between the base member and the second electrode and the film deposition rate.

As shown in FIG. 17, it was verified that the film deposition rate was high even if the distance between the base member and the second electrode was made wide, and that film deposition was possible at a film deposition rate of 1.1 nm/s or greater.

Next, in the i-type microcrystalline silicon film of the first photovoltaic conversion layer, a film was deposited up to a film thickness of 2 μm under conditions No. 5 in Table 1, and in the remaining 0.5 μm of film deposition was done with a change in a hydrogen gas flow rate that was from 42 times to 40 times that of the silane gas. The results were a film deposition rate of 1.6 nm/s and an improvement of 12.72% in the conversion efficiency.

Example 2

Next, referring to the graph shown in FIG. 18 and to Table 3, the results regarding the temperature variation and deterioration of the heated body 11, which was a heated catalyzer, for the case of depositing a microcrystalline silicon film will be described.

TABLE 3

| No. | Temperature of the heated catalyzer (° C.) | Number of thin-film depositions 50 | Number of thin-film depositions 100 | Number of thin-film depositions 150 |
|---|---|---|---|---|
| 22 | 25 | NG | NA | NA |
| 23 | 400 | G | NG | NA |
| 24 | 600 | G | NG | NA |
| 25 | 800 | G | G | G |
| 26 | 1500 | G | G | G |

Using the thin-film deposition apparatus S shown in FIG. 1, hydrogen gas, which is the first source gas, was supplied from the first supplying parts 4a and silane gas, which is the second source gas, was supplied from the second supplying parts 4b to inside the chamber 1. Then, the temperature of the heated body 11, which was a heated catalyzer, was fixed at 1500° C. during thin-film deposition, and a hydrogenated microcrystalline silicon film was deposited onto a base member 10 made of white plate glass. The surface temperature variations E1 to E5 of the heated body 11 during the manufacturing process shown in FIG. 18 correspond to No. 22 to No. 26 in Table 3.

The heated body 11 that was used was made by forming a 0.5-mm-diameter tantalum wire into a zig-zag shape.

With the space 8 inside of the chamber 1 in the vacuum-evacuated condition before supply of hydrogen gas, the temperature of the heated body 11 was pre-heated respectively to 25° C. (temperature variation E1: experiment 22 (comparison example)), 400° C. (temperature variation E2: No. 23), 600° C. (temperature variation E3: No. 24), 800° C. (temperature variation E4: No. 25), and 1500° C. (temperature variation E5: No. 26), and hydrogen gas was supplied to the inside of the chamber 1 while maintaining those temperatures.

In this case, the resistivity σ was calculated using the direct-current power voltage V and current I applied to the heated body 11, the cross-sectional area S of the heat catalyzer 11 and overall length L as $\sigma = R \times S/L = V/I \times S/L$, and the temperature of the heated body 11 was determined from the relationship between the temperature of the heated body 11 and the resistivity of the heated catalyzer (in this case, tantalum).

Hydrogen gas was introduced into the space 8 within the chamber 1 and, after adjusting the pressure in the chamber 1 to 1300 Pa, the temperature of the heated body 11 was further raised to the heating temperature (1500° C.) for No, 22 to No. 25 in Table 3.

After that, silane gas was introduced into the space 8 within the chamber 1, and high-frequency power was applied to the second electrode 2 at 450 W to excite a plasma. Then, a hydrogenated microcrystalline silicon film was deposited onto the base member 10.

After a prescribed amount of time, the application of high-frequency power was stopped, and the supply of silane gas was stopped. After that, while the supply of hydrogen was maintained. In the case of No. 22 to No. 25 in Table 3, the temperature of the heated body 11 was cooled to 25° C. (temperature variation E1: No. 22 (comparison example)), 400° C. (temperature variation E2: No. 23), 600° C. (temperature variation E3: No. 24), and 800° C. (temperature variation E4: No. 25), respectively. After that, the supply of hydrogen gas was stopped. In the case of No. 26 (temperature variation E5) in Table 3, the temperature of 1500° C. was maintained during the supply of hydrogen gas.

Figure 18:
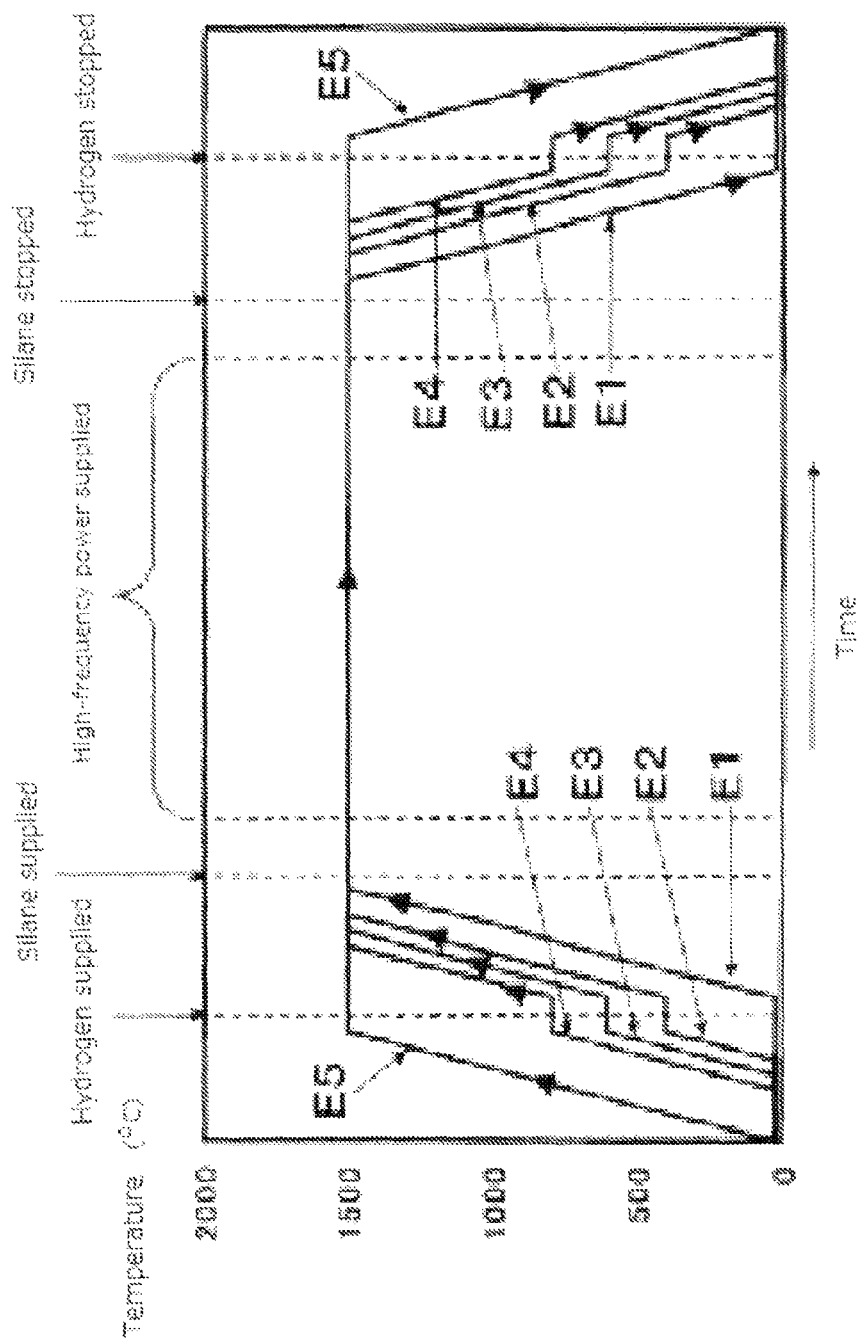
FIG. 18 is a diagram describing examples of the method for manufacturing a thin-film solar cell according to the present invention, showing a graph of the relationship between the time and the temperature of the heated catalyzer.

FIG. 18 shows the relationship of the supplying and stopping of the source gas accompanying the variation in temperature of the heated body 11. For each of the examples, 50, 100, and 150 cycles of heating step→gas supplying step→film deposition step→exhausting step→cooling step were performed. The condition of deterioration of the heated body 11 was verified after each of these numbers of cycles. The deterioration condition was evaluated based on whether, after each of the numbers of cycles, the heated body 11 could be broken by simply bending it by hand. The results are shown in Table 3. In Table 3, "NG" means that the heated body 11 was broken when bent, "G" means that it was not break, and "NA" means that evaluation of the heated body 11 by bending was not done.

With No. 22 of Table 3, which is a comparison example, after 50 cycles of the above-noted series of process steps, when the heated body 11 was bent, it had already lost its ductility and was easily broken. With No. 23 and No. 24 (temperature variations E2 and E3) of Table 3, at the point of performing 100 cycles of the above-noted series of process steps, breakage was verified. With No. 25 and 26 (temperature variations E5 and E6) of Table 3, even after performing 150 cycles of the above-noted series of process steps, the heated bodies 11 were not broken and maintained their ductility, and were in a condition that would enable further use. From the above-noted results, it was verified that, by setting the temperature of the heated body 11 to 800° C. or higher and supplying hydrogen gas while maintaining that temperature, there was a reduction in the deterioration of the heated body 11.

In the above-noted evaluation, thermal desorption spectroscopy (TDS) was used to verify the hydrogen absorbed in or the hydrogen captured, as hydride, in the heated bodies 11 that was broken and heated bodies 11 that was not broken. While a large amount of hydrogen was verified in the heated bodies 11 that was broken, almost no hydrogen was verified in the heated bodies 11 that was not broken. In this manner, it was possible to verify by TDS as well the hydrogen absorption by pre-healing the heated body 11, and also the reduction of the deterioration of the heated body 11 by the suppression of hydride producing reactions.

In this manner, it was understood that, by pre-heating the heated catalyzer to 800° C. or higher and then supplying hydrogen gas, it is possible to suppress deterioration of the heated catalyzer without changing the film deposition parameters or changing the material or structure of the heated catalyzer, and that it is possible improve productivity by lengthening the maintenance cycle, without any influence on the film quality or film deposition rate.

Example 3

Next, the results of an evaluation that was performed of the crystallization rate of hydrogenated microcrystalline silicon films will be described. Using the thin-film deposition apparatus S shown in FIG. 1, hydrogen gas, which is the first source gas, was supplied from the first supplying parts 4a to inside the chamber 1. Also, silane gas, which is the second source gas, was supplied from the second supplying parts 4b to inside the chamber 1. In this case, the $H_2/SiH_4$ gas flow amount ratio was set to 45/1, and the high-frequency power density (frequency: 27 MHz) was set to (196 W/cm². Also, for the cases of the gas pressures being 300 Pa and 1300 Pa, the temperature of the heated body 11 when depositing the thin film was varied and hydrogenated microcrystalline silicon films were deposited onto a base member 10 made of white plate glass.

Specifically, for No. 27 to No. 38 shown in Table 4, an evaluation was made of the crystallization rate of the hydrogenated microcrystalline silicon film deposited under the conditions of internal chamber 1 pressure and heated body 11 temperature shown in Table 4. For the crystallization rate, the Raman peak intensity ratio (crystalline phase peak intensity/amorphous phase peak intensity) in the Raman scattering spectrum was verified, and the crystallization rate was calculated from the relationship between the Raman peak surface area ratio and the Raman peak intensity ratio (refer to Ichikawa, Yukimi et al "Plasma semiconductor process engineering" Uchida Rokakuho Shuppan, 2003, p. 178). The crystalline phase peak intensity was defined as the peak intensity at 520 $cm^{-1}$ and the amorphous phase peak intensity was defined as the peak intensity at 480 $cm^{-1}$. The Raman spectrum measurement was done using a Ramanscope System 1000, made by Renishaw, which uses a He—Ne laser (wavelength: 632.8 nm) as the excitation light. The results are shown in Table 4.

TABLE 4

| No. | Pressure (Pa) | Temperature (° C.) | Crystallization rate (%) |
| --- | --- | --- | --- |
| 27 | 300 | No heating | 0 |
| 28 | 300 | 400 | 0 |
| 29 | 300 | 800 | 2 |
| 30 | 300 | 1000 | 5 |
| 31 | 300 | 1200 | 12 |
| 32 | 300 | 1500 | 62 |
| 33 | 1300 | No heating | 0 |
| 34 | 1300 | 400 | 53 |
| 35 | 1300 | 800 | 56 |
| 36 | 1300 | 1000 | 56 |
| 37 | 1300 | 1200 | 57 |
| 38 | 1300 | 1500 | 59 |

From the results shown in Table 4, for a hydrogenated microcrystalline silicon film deposited under the low-pressure condition of 300 Pa for the gas pressure within the chamber 1, if the temperature of the heated body 11 is 1000° C. or lower, the crystallization ratio was verified to be 5% or lower, and at a heated body temperature of 400° C. or lower, crystallization was not observed. In contrast, for a hydrogenated microcrystalline silicon film deposited under the high-pressure condition of 1300 Pa for the gas pressure within the chamber 1, if the temperature of the heated body 11 is 1000° C. or lower (excluding the non-heated case), the crystallization ratio was verified to be 53% or higher and crystallization was verified.

Example 4

Next, an example of a variation example of the above-described manufacturing method will be described. Thin-film solar cells were formed using a thin-film deposition apparatus S such as shown in FIG. 6.

First, a first conductive layer made of an $SnO_2$ film having a thickness of 800 nm was formed on the base member 10 of a glass substrate, using thermal CVD method. Then, a first photovoltaic conversion layer was formed on the first conductive layer. The first conductive layer was laminated by successive lamination of a p-type, an i-type, and an n-type amorphous silicon film, on which an n-type microcrystalline silicon film was laminated. In this case, the i-type amorphous silicon film thickness was made 250 nm. Then, a second photovoltaic conversion layer was formed on the first photovoltaic conversion layer. The second photovoltaic conversion layer was formed by successive lamination of a p-type and an i-type microcrystalline silicon film, on which an n-type amorphous silicon film was laminated. In this case the i-type microcrystalline silicon film thickness was made 2.5 μm. Silane gas and hydrogen gas were used as the source gases, and as doping gases, $B_2H_6$ was used for the p-type semiconductor layer, and $PH_3$ was used for the n-type semiconductor layer. A second conductive layer made of a ZnO film having a film thickness of 10 nm and a third conductive layer made of a silver having a thickness of 300 nm were formed on the second photovoltaic conversion layer In this example, the heated body, which was a heated catalyzer, was heated to 1500° C. only for the deposition of the i-type microcrystalline silicon film, and the heated catalyzer was not heated for the other films. The material and the shape of the heated body 11 were the same as in example 1.

Regarding No. 39 and No. 40 of Table 5, the regions A1 occupied by the heated body 11 were made, respectively, regions wider than the region A2 of the base member by 20 mm and 40 mm toward the outside, Regarding No. 41 and No. 42, which are comparison examples, the regions A1 occupied by the heated body 11 were made, respectively, regions narrower than the region A2 of the base member by 20 mm and 40 mm toward the inside. The region A3 occupied by the first supplying part was made wider than the region A2 of the base member by 30 mm toward the outside. A distribution plate 13 that was provided with a plurality of gas jet ports each having φ0.5 mm, and a radiation blocking member 14 were installed upstream and downstream, respectively, of the heated body 11, so as to have a region wider than the region A2 by 30 mm toward the outside. The conversion efficiencies in solar cells fabricated under each condition were measured, and the differences in the average conversion efficiencies at the center part of the base member 10 and the average conversion efficiencies at the four corners of the base member 10 were compared. The results are shown in Table 5.

TABLE 5

| No. | Center part average conversion efficiency (%) | Four corner average conversion efficiency (%) | Difference (%) |
|---|---|---|---|
| 39 | 12.33 | 12.01 | −0.32 |
| 40 | 12.35 | 12.38 | +0.03 |
| 41 | 12.29 | 4.88 | −7.41 |
| 42 | 12.22 | 3.32 | −8.90 |

As can be understood from Table 5, in the case of region A1<region A2, a film with a preferable crystallization condition can't be formed at the four corners of the base member 10, but a film with the amorphous condition, thereby resulting in the average conversion efficiency being 5% or lower. In contrast, in the case of region A1>region A2, the distribution of crystallization ratio over the surface of the film was good, and the uniformity of the conversion efficiency over the surface was improved. Also, when No. 39 and No. 40 in Table 5 were compared, it was verified that by making the region A1 occupied by the heated body 11>the region A4 of the gas jet ports of the distribution plate 13, there is an improvement in the average conversion efficiency at the four corners, without a weakening of the gas heating effect.

Example 5

Next, a specific example in which the method of holding the heated body, which is a heated catalyzer, is changed will be described. In method 1, the heated body was held by only a support frame for supporting the heated body, and a zig-zag shaped heated body was used, as in example 2. In contrast, in method 2, a supplementary member made of quartz was mounted to the support frame, so that the heated body was supported not only by the support frame, but also by the supplementary member.

Then, similar to example 1, a first photovoltaic conversion layer having an i-type amorphous silicon film, and a second photovoltaic conversion layer having an i-type microcrystalline silicon film were successively laminated to form a thin-film solar cell. In this case, when depositing the i-type microcrystalline silicon film, the heated body was heated to a temperature of 1500° C. The fabrication of the thin-film solar cell was repeated 100 times.

The thin-film solar cells fabricated under each condition were divided in 16, and conversion efficiencies in each of the regions thereof were measured. A comparison was made of the lowest conversion efficiency over the surface region of the thin-film solar cell fabricated at the first time and the lowest conversion efficiency over the surface region of the thin-film solar cell fabricated at the one-hundredth time.

As a result, in contrast to method 1, in which there was a 22% decrease in the photovoltaic conversion efficiency in the thin-film solar cell fabricated on the one-hundredth time compared to the thin-film solar cell fabricated on the first time, the decrease using method 2 was limited to 5%. It is thought that the large reduction in photovoltaic conversion efficiency with method 1 is due to deformation of the heated bodies. That is, it is thought that, in a thin-film solar cell fabricated with an adjacent heated bodies that deform and are tightly concentrated, the crystallization rate rises significantly, and because of exceeding a crystallization rate preferable for photovoltaic conversion, the characteristics worsen.

DESCRIPTION OF THE REFERENCE SYMBOLS

1 Chamber
2 Second electrode
4 Supplying part
4a First supplying part
4b Second supplying part
5 High-frequency power supply
6 First electrode
10 Base member
11 Heated body
31 First conductive layer
32 First photovoltaic conversion layer
33 Second photovoltaic conversion layer
34 Second conductive layer
35 Third conductive layer
S Thin-film deposition apparatus

The invention claimed is:

1. A method for manufacturing a thin-film solar cell using a plasma between parallel electrodes, the method comprising:
   placing a base member in a chamber between a first electrode and a second electrode facing each other;
   placing a heated body in a flow passage from a hydrogen gas source to the base member;
   introducing hydrogen gas through the flow passage;
   heating the hydrogen gas using the heated body;
   introducing a silicon-based gas and the heated hydrogen gas into a space between the first electrode and the second electrode, wherein a ratio of a flow rate of hydrogen gas to that of the silicon-based gas is at least 25 times and no more than 58 times;
   keeping a pressure in the chamber 1000 Pa or higher;
   generating a plasma between the first electrode and the second electrode by applying high-frequency power to the second electrode;
   depositing at least one photovoltaic conversion layer including a photoactive layer containing crystalline silicon on the base member;
   stopping the supply of the silicon-based gas;
   stopping the supply of the hydrogen gas after stopping the supply of the silicon-based gas;
   evacuating the inside of the chamber after stopping the supply of the hydrogen gas; and
   cooling the heated body after evacuating the inside of the chamber.

2. The method according to claim 1, wherein the silicon-based gas comprises at least one selected from silane, disilane, silicon tetrafluoride, silicon hexafluoride and dichlorosilane.

3. The method according to claim 1, further comprising setting a distance between the base member and the second electrode to 5 mm or greater and no greater than 15 mm.

4. The method according to claim 1, wherein the heated body comprises a heated catalyzer or a resistance heater.

5. The method according to claim 1, wherein the heated body is heated to at least 800° C.

6. The method according to claim 1, wherein, the power density of the high-frequency power is at least $0.5/cm^2$ and no greater than $1.7 W/cm^2$.

7. The method according to claim 1, wherein, the frequency of the high-frequency power is at least 13.56 MHz and no greater than 40.68 MHz.

8. The method according to claim 1, further comprising making the flow rate ratio smaller during the deposition than that at the beginning of the deposition.

9. The method according to claim 1, wherein the introducing the silicon-based gas and hydrogen gas comprises introducing the silicon-based gas followed by introducing hydrogen gas.

10. The method according to claim 1, further comprising heating the base member to at least 180° C. and no greater than 220° C. after depositing the photoactive layer is completed.

11. The method according to claim 1, wherein, cooling the heated body comprises taking the base member outside the chamber.

* * * * *